United States Patent [19]
Kubono et al.

[11] Patent Number: 5,272,676
[45] Date of Patent: Dec. 21, 1993

[54] SEMICONDUCTOR INTEGRATED CIRCUIT DEVICE

[75] Inventors: Shoji Kubono, Akishima; Hiroshi Sato, Ohme, both of Japan

[73] Assignees: Hitachi, Ltd.; Hitachivlsi Engineering Corp., both of Tokyo, Japan

[21] Appl. No.: 789,018

[22] Filed: Nov. 6, 1991

[30] Foreign Application Priority Data

Nov. 20, 1990 [JP] Japan .................. 2-315130

[51] Int. Cl.⁵ .................................. G11C 7/00
[52] U.S. Cl. .................. 365/222; 365/189.07; 365/227
[58] Field of Search ............ 365/222, 189.07, 210, 365/226, 227, 228; 235/380, 492

[56] References Cited

U.S. PATENT DOCUMENTS

| 4,500,974 | 2/1985 | Nagami ........................ 365/222 |
| 4,711,406 | 9/1988 | Oishi et al. ................... 365/222 |

FOREIGN PATENT DOCUMENTS

56-27952 8/1979 Japan .
60-83293 10/1983 Japan .
60-212896 10/1985 Japan .................. 365/222
62-154293 7/1987 Japan .................. 365/222

*Primary Examiner*—Eugene R. LaRoche
*Assistant Examiner*—Tan Nguyen
*Attorney, Agent, or Firm*—Antonelli, Terry, Stout & Kraus

[57] ABSTRACT

The self-refresh operation of one round of a RAM using dynamic memory cells is accomplished on the basis of the periodic pulses which are formed by an oscillating circuit substantially having no temperature dependency, and the self-refresh period is controlled by a timer circuit using a time constant circuit corresponding to the temperature dependency of the data storage in the memory cells. The operating voltage or boosted output voltage is monitored to switch the circuit operation for generating a plurality kinds of boosted voltages rising sequentially two and three times so that the boosted voltage may be a desired voltage. A control voltage to be fed to the gate of a MOSFET connected between the substrate and the earth potential of the circuit is generated by a dummy substrate voltage generator having a leakage current path varying to follow the fluctuations in a supply voltage.

10 Claims, 15 Drawing Sheets

(READ-MODIFY-WRITE CYCLES)

(AUTO-REFRESH CYCLE)

SEMICONDUCTOR INTEGRATED CIRCUIT DEVICE

BACKGROUND OF THE INVENTION

The present invention relates to a semiconductor integrated circuit device and, more particularly, to a technology which is effective for use in a semiconductor integrated circuit device including a RAM (i.e., Random Access Memory) having dynamic memory cells to be backed up by a relatively low voltage of a battery.

There has been proposed in Japanese Patent Laid-Open No. 83293/1985 a dynamic RAM which is composed of a plurality of dummy cells so that the amount of stored data may be monitored with the data storage level of the dummy cells to start an automatic refresh circuit before the data are lost.

SUMMARY OF THE INVENTION

The automatic refresh system described above is required to monitor the amount of data storage of the dummy cells similar to the memory cells. As a matter of fact, however, if these similar dummy cells are used, their data storing capacitors have a smaller value of capacitance than that of the input capacity or wiring capacity of their monitoring comparators or the like. Due to the influences of the input or wiring capacity, therefore, it is extremely difficult to ensure an accurate correspondence between the amounts of data storage of the monitored dummy cells and the actual memory cells. Especially in the dynamic RAM of about 4 or 16M bits having fine elements, it is a tendency that the data storing capacitors are given lower capacities. Thus, it could not exaggerate that the aforementioned automatic refresh circuit expects a reliable refresh operation.

On the other hand, a battery backup is conceivable to make the stored data of the dynamic RAM non-volatile against an interruption of power supply. Our investigations have revealed that the battery backup will cause, if at a lower voltage, a problem that a word line booster circuit or a substrate voltage generator of the prior art is encountered by shortage of the level or by an insufficient operation.

An object of the present invention is to provide a semiconductor integrated circuit device which is equipped with a RAM circuit having a self-refresh function of lower power consumption.

Another object of the present invention is to provide a semiconductor integrated circuit device which is equipped with a variable booster circuit capable of generating an optimum boosted voltage corresponding to the supply voltage or boosted output.

Still another object of the present invention is to provide a semiconductor integrated circuit device which is equipped with a substrate voltage generator capable of generating a substrate bias voltage following the fluctuations of the power supply while reducing the power consumption.

A further object of the present invention is to provide a semiconductor integrated circuit device which is equipped with a RAM circuit using dynamic memory cells so that it can back up the battery at a low voltage.

The foregoing and other objects and novel features of the present invention will become apparent from the description to be made with reference to the accompanying drawings.

A representative one of the invention to be disclosed hereinafter will be briefly summarized in the following. One round of self-refresh operation of a RAM using dynamic memory cells is executed on the basis of periodic pulses which are generated by an oscillator having no substantial temperature dependency, and the self-refresh period is controlled by a timer circuit which uses a time constant circuit corresponding to the temperature dependency of data storage of the memory cells. The operating voltage or boosted output voltage is monitored to switch the circuit operation for generating plural kinds of boosted voltages sequentially rising two times, three times and so on, so that the boosted voltage may take a desired level. The control voltage to be fed to the gates of MOSFETs connected between the substrate and the earth potential points of the circuit is generated by a dummy substrate voltage generator which has a leakage current path changing with the fluctuations of the supply voltage.

According to the above-specified means, the refresh operation of low power consumption fitted for the amount of data storage of the memory cells can be realized by a timer using a time constant circuit. The operation margin can be extended by a variable boost established to correspond to the fluctuations of the operating voltage. The substrate voltage can be changed following the supply voltage without any increase in the substrate leakage current by the MOSFETs which are controlled by the dummy substrate voltage generator.

BRIEF DESCRIPTION OF THE DRAWINGS

FIG. 2 is a block diagram showing one embodiment of a selector, a timing generator and a voltage generator of a quasi-static RAM to be used in the memory card or the like;

DESCRIPTION OF THE PREFERRED EMBODIMENTS

Figure 1:
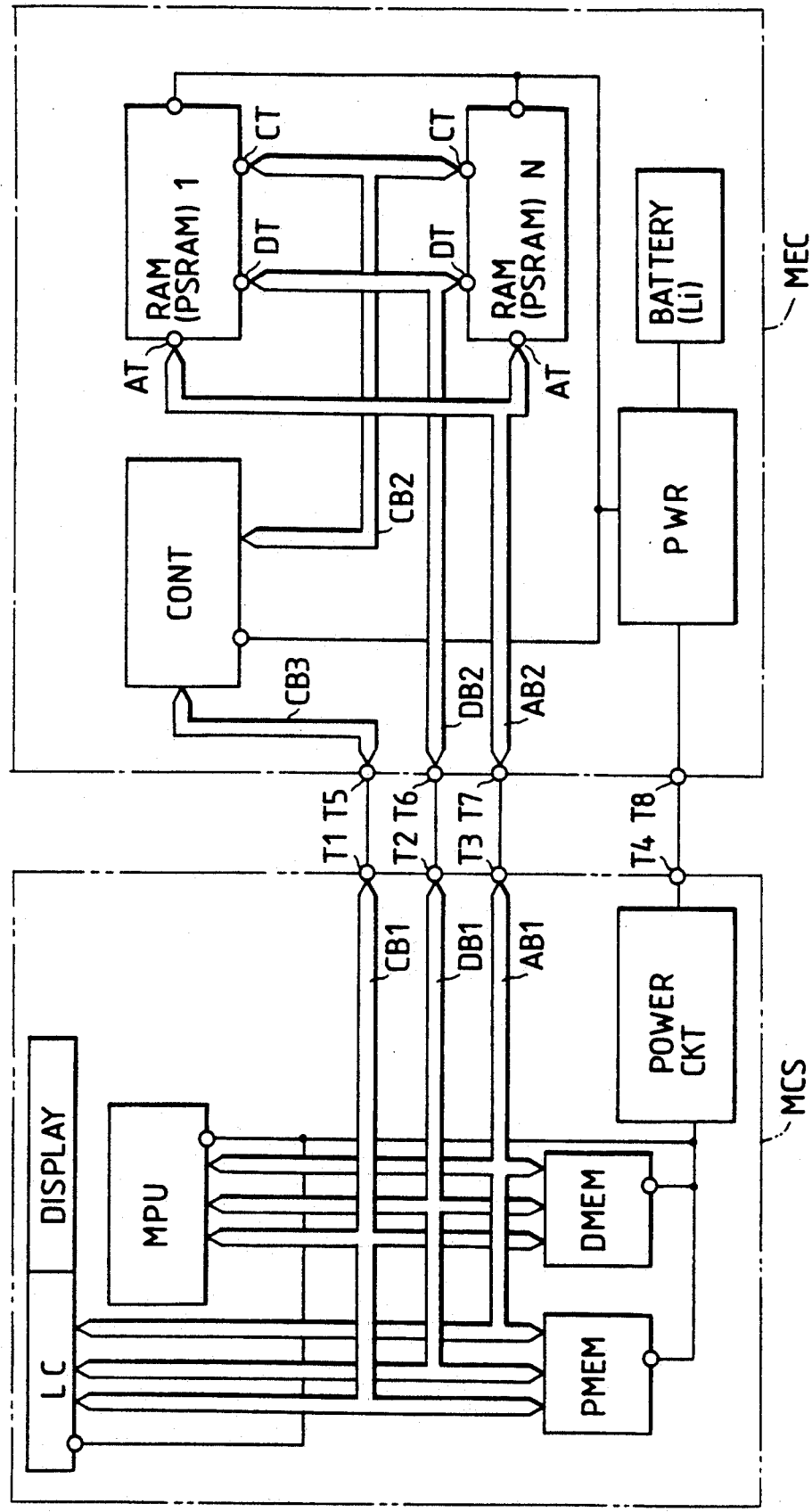
FIG. 1 is a block diagram showing one embodiment of a memory card according to the present invention.

FIG. 1 shows one embodiment of a computer system which uses a memory device including semiconductor memory RAMs according to the present invention. The memory device is exemplified by a memory card MEC including circuit blocks, each of which is constructed, except the battery, of a CMOS integrated circuit device of one chip. These plural semiconductor chips are packaged in a card shape integrally with the battery, although not especially limitative thereto.

Each chip is composed of one to an N-number of semiconductor RAMs, each of which is equipped with a control terminal CT, a data terminal DT and an address terminal AT. Each of control buses CB2 and CB3, a data bus DB2 and an address bus AB2 is composed of a plurality of signal lines. The aforementioned individual control terminal CT, data terminal DT and address terminal AT, and terminals T5 to T7 are provided in numbers corresponding to those of the signal lines of the control bus CB, the data bus DB and the address bus AB. By thus using the N-number of semiconductor memory RAMs, the storage capacity as the memory card is N times as large as that owned by one RAM. The semiconductor RAM is constructed, although not especially limitative, of a quasi-static RAM (as may be shortly referred to as the "PSRAM"), which has its input/output interface made interchangeable with a static RAM while using dynamic memory cells composed of address selecting MOSFETs and data storing capacitors, as will be described. By using the dynamic memory cells as the memory cells, as described above, a relatively large storage capacity can be realized even in the limited packaging space as in the memory card.

A control circuit CONT performs the selection of the aforementioned one or more semiconductor memory RAMs and the control of operating modes. Specifically, the control circuit CONT is connected through the terminal T5 especially for a control signal with a terminal T1 of a microcomputer system MCS. In response to a control signal outputted from a microprocessor MPU through a control bus CB1 and the terminal T1, the control circuit CONT decodes the system address of a less significant bit to generate a chip enable signal $\overline{CE}$ for selecting one of the N-number of semiconductor memory RAMs, and a write enable signal $\overline{WE}$ and an output enable signal $\overline{OE}$ for read/write controls.

The data bus DB2 to be connected with the data terminal DT of the aforementioned semiconductor memory RAM is connected with the terminal T6 especially for data. Moreover, the address bus AB2 to be connected with the address terminal AT of the semiconductor memory RAM is connected with the terminal T7 especially for addresses.

A power control circuit PWR receives both the voltage of a (lithium) battery mounted in the memory card MEC and the supply voltage fed from the power circuit of the microcomputer system MCS through a supply voltage terminal T8, to switch them in accordance with the operating mode and feed the switched voltages to the internal semiconductor memory RAM and the control circuit CONT. If the semiconductor memory RAM is in the data holding state, for example, the power control circuit PWR supplies the voltage of the battery mounted in the memory card MEC. If, on the contrary, the memory card MEC of this embodiment is connected with the microcomputer system MCS, the supply voltage is switched to operate the microcomputer system MCS. In this case, the microcomputer system MCS constitutes portable microcomputer systems or various kinds of personal computers of laptop, notebook or palmtop types. Each of the circuit blocks (except a battery to be mounted in the power supply circuit or a display) of the microcomputer system MCS is constructed of a semiconductor integrated circuit of one chip. The microcomputer system MCS is equipped with a program memory PMEM written with an instruction to be executed by the microprocessor MPU and a data memory DMEM for storing the data to be or having been processed by the microprocessor MPU in accordance with an instruction coming from the program memory PMEM. A level converter LC converts the data stored in the data memory DMEM, for example, into those to be displayed. The microprocessor MPU, the program memory PMEM, the data memory DMEM and the lever converter LC are coupled through the control bus CB1, a data bus DB1 and an address bus AB1. Moreover, the microprocessor MPU, the program memory PMEM and the data memory DMEM are fed with the operating supply voltage from the power supply circuit.

For example, if the memory card MEC is constructed of the four semiconductor memory RAMs each having a data holding current of 5 $\mu$A and if the lithium battery of CR2430 type having a nominal capacity of 250 mAh and mounted on the memory card MEC is used only in the data holding state, the battery need not be exchanged for a time period as long as about 520 days.

The battery used mainly in a small-sized electronic device at present is classified into the aforementioned lithium battery, the nickel-cadmium battery and the lead battery. The voltages to be generated by those batteries are 2.8 to 3.6 V for the Li battery, 1.2 V for the Ni-Cd Battery and 2 V for the Pb battery. Of these, the Ni-Cd battery is frequently available at the market in the series connection of plural cells so that it has an output voltage of 2.4 V and 3.6 V, for example.

Therefore, the circuit elements composing the semiconductor memory RAM and the control circuit CONT have their operations warranted at the battery voltage within the aforementioned range of 3.6 V to 1.6 V by using the CMOS technology of having their gate insulating films made as thin as possible and their channel lengths shortened, although not especially limited thereto. This technology comes from a consideration that the maximum voltage is based upon the battery voltage of 3.6 V whereas the minimum voltage is up to such a value of about 1.6 V as can establish an electric current necessary for the operations of the CMOS circuit even with the Pb cell having been discharged to some extent. As a result, it can obtain a memory card which can be operated with any of three kinds of small-sized batteries, i.e., the Li battery of 3.6 V, the two-series connected Ni-Cd battery of 2.4 V and the Pb battery of 2 V.

For compatibility with the interface of an external microcomputer system or the like, in this case, the control circuit CONT or the power control circuit PWR is constructed of a circuit or its standard IC corresponding to the ICs of 74HC series and/or 74AC series for the CMOS logic. Moreover, the semiconductor memory RAM also has its input/output interfaces designed to correspond the aforementioned 74HC series and/or 74AC series.

This semiconductor memory RAM is further given the interface specifications satisfying the international ones of the CMOS circuit considering the operations with the low battery voltage, such as LVCMOS (i.e., Low Voltage CMOS) or LVBO (i.e., Low Voltage Battery Operated CMOS) described in JEDEC STANDARD No. 8, 1984.

In order to satisfy the interface specifications described above, the semiconductor memory RAM of this embodiment has its interface specifications determined, as enumerated in the following Table-1:

TABLE 1

| Items | Specifications | | |
|---|---|---|---|
| | Min. | Typ. | Max. |
| VCC | 1.6 V | 2.6 V | 3.6 V |
| $V_{IH(min)}$ | 1.1 V | 1.8 V | 2.5 V |
| $V_{IL(max)}$ | 0.4 V | 0.8 V | 1.1 V |
| $V_{IH(max)}$ | 2.1 V | 3.1 V | 4.1 V |
| $V_{IL(min)}$ | −0.5 V | −0.5 V | −0.5 V |

Here: VCC: the supply voltage; $V_{IH(min)}$: the minimum of the input high level; $V_{IL(max)}$: the maximum of the input low level; $V_{IH(max)}$: the maximum of the input high level; and $V_{IL(min)}$: the minimum of the input low level.

In the aforementioned standard interface specifications, the minimum operating voltage VCC(min) is up to 2 V for the 74HC series and the LVBO and up to 3 V for the LVCMOS. In this embodiment, the voltage or the like of the Pb battery at the discharge time is considered to set the minimum operating voltage VCC(min) to 1.6 V. In the aforementioned standard interface, however, the voltage determined by multiplying the supply voltage VCC by 0.75 or 0.7 is set at $V_{IH(min)}$, and the voltage determined by multiplying the supply voltage VCC by 0.15 or 0.2 is set at $V_{IL(max)}$. Therefore, the interface specifications at the minimum operating voltage of this embodiment are set to match the strict ones of the aforementioned conditions.

The P-channel MOSFETs and N-channel MOSFET composing not only the input circuits of the semiconductor memory RAM such as the address buffer or data input buffer but also the output buffer of the same have their conductances and ratios set to satisfy the interface specifications, as enumerated in the foregoing Table-1.

Incidentally, in case the aforementioned operation warranting voltage is set to a level of 1.6 V lower than the lowermost voltage 2 V of the Pb battery, it is possible to attain not only an advantage of using the current capacity of the Pb battery to the last but also the following advantage.

Let the case be considered, in which the Pb battery is used as a built-in battery for latching the data of the semiconductor memory RAM, in other words, for backing up the battery to make the stored data nonvolatile. If, in this case, the memory card is connected with a microcomputer system to be operated by the Li battery, a backward flow preventing diode has to be provided for preventing any backward flow in the built-in Pb battery. With this backward flow preventing diode being connected, a voltage loss occurs in an amount corresponding to the forward voltage of the diode. If the minimum voltage is set at the value of 2 V of the Pb battery, this battery cannot be used as the backup battery. If, on the contrary, the minimum voltage is warranted, as in this embodiment, to a voltage of 1.6 V lower than the voltage of the Pb battery, this battery can be used as a backup battery. In this case, the diode may be exemplified by a Schottky diode having a low forward voltage.

Figure 2:
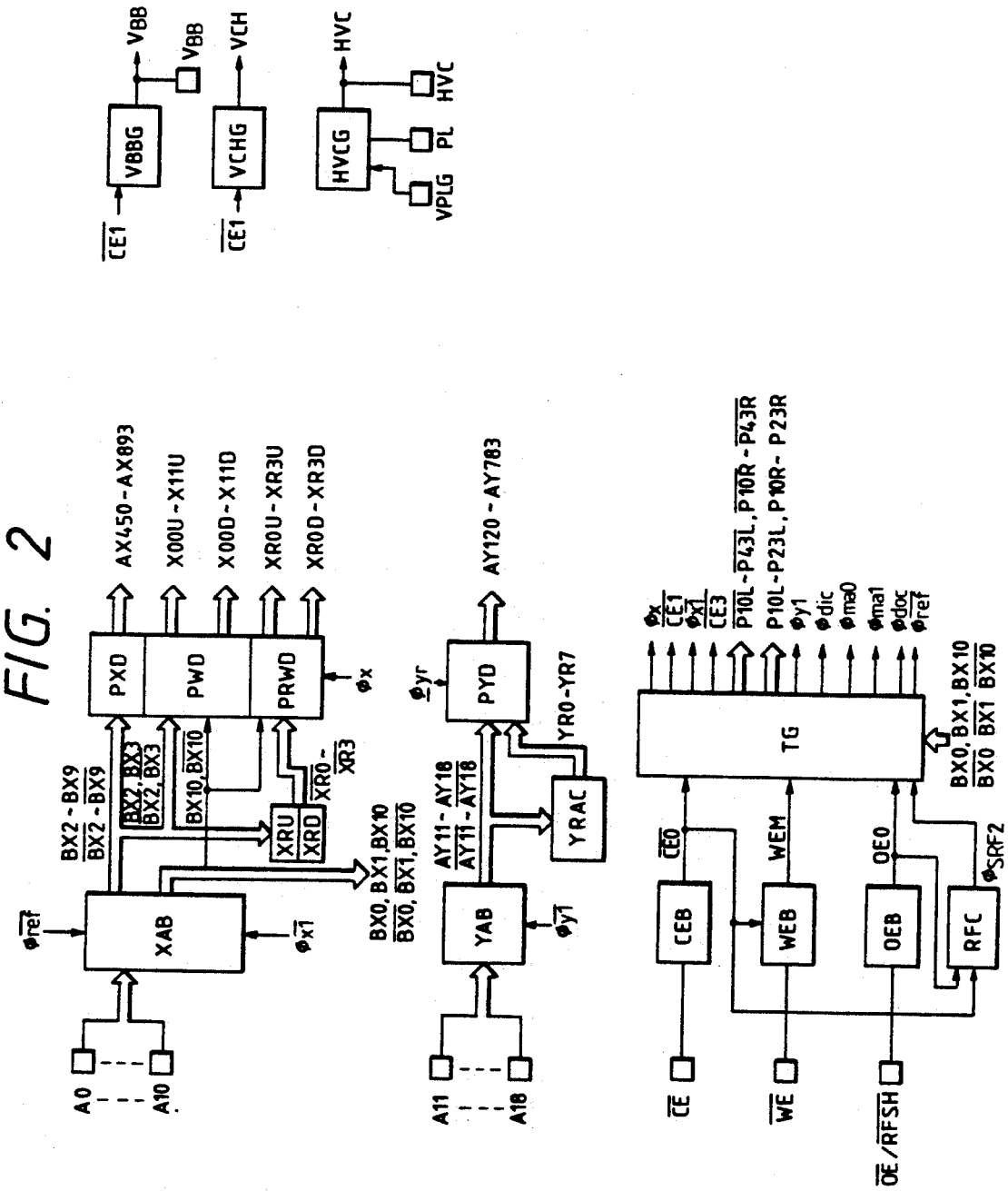
Figure 3:
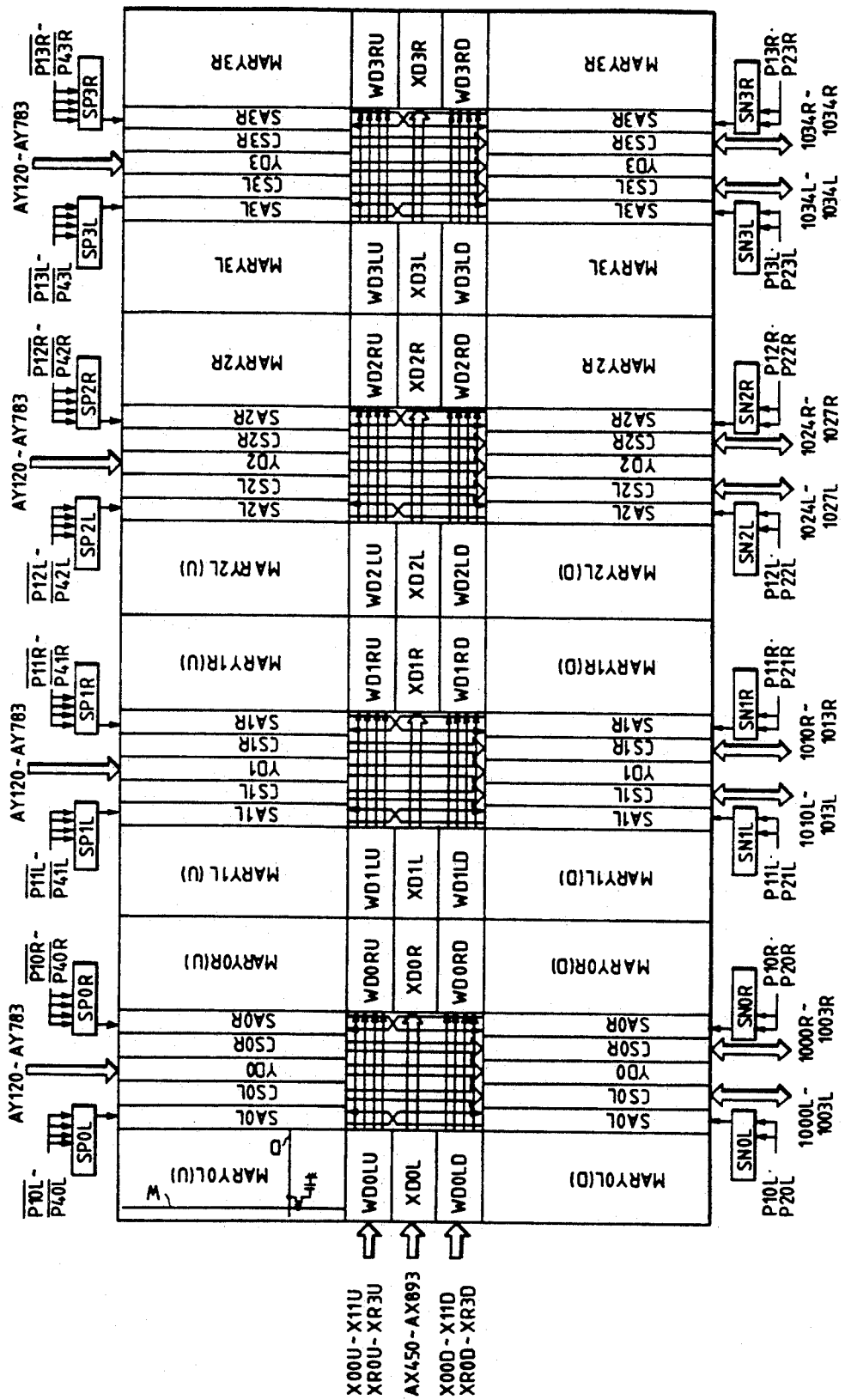
FIG. 3 is a block diagram showing one embodiment of the memory array of the quasi-static RAM.
Figure 4:
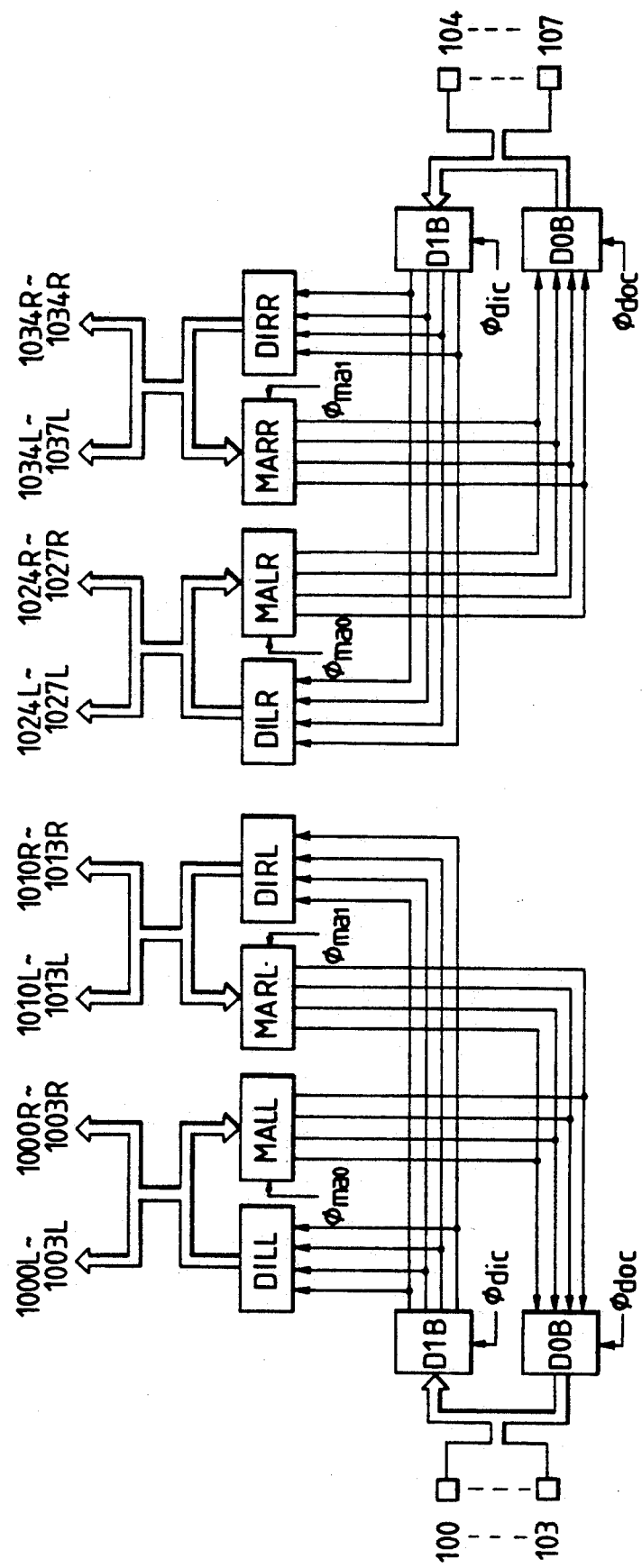
FIG. 4 is a block diagram showing one embodiment of a direct peripheral circuit and a data input/output circuit of the quasi-static RAM.

FIG. 2 is a block diagram showing one embodiment of a selector, a timing generator and a voltage generator of a quasi-static RAM to be used in the memory card thus far described. On the other hand, FIGS. 3 and 4 are block diagrams showing one embodiment of a memory array, a direct peripheral circuit and a data input/output circuit of the aforementioned quasi-static RAM, individually. The circuit elements composing the individual blocks of FIGS. 2 to 4 are formed over a single semiconductor substrate which is made of a P-type single crystal silicon by the well-known manufacture technology of the CMOS integrated circuit, although not especially limited thereto. In the circuit diagrams of FIGS. 2 and 3 and so on, on the other hand, the signal lines for input or output signals are indicated to start from the bonding pads formed on the semiconductor substrate.

The quasi-static RAM of this embodiment is basically constructed of the dynamic RAM, as has been described, which has its memory cells composed of the so-called "one MOSFET type dynamic memory cells", to integrate the circuit highly and reduce the power consumption. The quasi-static RAM is fed with X-address signals X0 to X10 and Y-address signals Y11 to Y18 through individual address input terminals A0 to A10 and A11 to A18 and is provided as control signals with a chip enable signal $\overline{CE}$, a write enable signal $\overline{WE}$ and an output enable signal $\overline{OE}$ so that it has an input/output interface made compatible with the ordinary static RAM. Moreover, the quasi-static RAM has: an auto-refresh mode, in which the refresh operation is accomplished in a single shot while being addressed by a refresh counter RFC having a refresh address; and a self-refresh mode, in which the refresh operations for all word lines are executed in a self-controlled manner and intermittently for a predetermined period by using a refresh timer having the aforementioned refresh counter RFC and a refresh timer counter.

In this embodiment, the aforementioned output enable signal $\overline{OE}$ is also used as a refresh control signal $\overline{RFSH}$, although not especially limited thereto. The output enable signal $\overline{OE}$ and the write enable signal $\overline{WE}$ sets the operating modes of the quasi-static RAM selectively.

In FIG. 2, the chip enable signal $\overline{CE}$, the write enable signal $\overline{WE}$, and the output enable signal $\overline{OE}$, i.e., the refresh control signal RFSH are fed as the start control signals from the outside to a timing generator TG through corresponding input buffers CEB, WEB and OEB. Moreover, the refresh address counter RFC receives the signals from the input buffers CEB and OEB to feed a refresh signal $\phi$SRF2 to the timing generator TG. This timing generator TG is fed from an X-address buffer XAB with complementary internal address signals $\underline{BX0}$, $\underline{BX1}$ and $\underline{BX10}$ (wherein the non-inverted internal address signal $\overline{BX0}$ and the inverted internal address signal BX0 are expressed together as the complementary internal address signal $\underline{BX0}$, as in the following for the complementary signals). On the basis of the aforementioned chip enable signal $\overline{CE}$, write enable signal $\overline{WE}$, output enable signal $\overline{OE}$, refresh signal $\phi$SRF2, and complementary internal address signals $\underline{BX0}$, $\underline{BX1}$ and $\underline{BX10}$, the timing generator TG forms a variety of timing signals necessary for the operations of the individual circuit blocks of the quasi-static RAM.

The X-address signals X0 to X10 of 11 bits fed from the outside through the corresponding address input terminals A0 to A10 are fed to the input terminal of an X-address buffer XAB, although not especially limited thereto, and the Y-address signals Y11 to Y18 of 8 bits are fed to a Y-address buffer YAB. The X-address buffer XAB is fed from the timing generator TG with inverted timing signals $\overline{\phi_{ref}}$ and $\overline{\phi_{x1}}$, and the Y-address buffer YAB is fed with an inverted timing signal $\overline{\phi_{y1}}$. Here, the inverted timing signal $\overline{\phi_{ref}}$ is selectively set to the low level, if the quasi-static RAM is selected in the auto-refresh or self-refresh mode. The timing signals $\overline{\phi_{x1}}$ and $\overline{\phi_{y1}}$ are selectively set to the low level, when the X-address signals X0 to X10, the refresh address signals AR0 to AR10 or the Y-address signals Y11 to Y18 have their fixed if the quasi-static RAM is in the selected state.

The X-address buffer XAB fetches and latches the X-address signals X0 to X10, which are fed through the external terminal, in response to the inverted timing signal $\overline{\phi_{x1}}$ when the quasi-static RAM is selected in the ordinary write or read mode so that the inverted timing signal $\overline{\phi_{ref}}$ is set to the high level. The X-address buffer XAB forms the complementary internal address signals $\underline{BX0}$ to $\underline{BX10}$ from those X-address signals X0 to X10. Of these, the complementary internal address signals $\underline{BX0}$ to $\underline{BX1}$ of less significant 2 bits and the complementary internal address signal $\underline{BX10}$ of the most significant 1 bit are fed to the timing generator TG, as has been described hereinbefore, and the complementary internal address signals BX2, BX3 and BX10 of 3 bits are fed to a word line selecting drive signal generator PWD. The remaining complementary internal address signals $\underline{BX4}$ to $\underline{BX9}$ are fed to an X-predecoder PXD. The complementary internal address signals $\underline{BX2}$ to $\underline{BX9}$ are further fed to an X-redundancy circuit XR.

Each memory array of the quasi-static RAM is equipped with four redundancy word lines and eight sets of redundancy complementary data lines. The X-redundancy circuit XR (XRU and XRD) compares and collates, for each bit, the defective address assigned to each redundancy word line and the complementary internal address signals $\underline{BX2}$ to $\underline{BX9}$ fed through the aforementioned X-address buffer $\overline{XAB}$ at the time of a memory access. If the result is that the addresses are coincident with all bits, the X-redundancy circuit XR sets the corresponding inverted redundancy word line selecting signals $\overline{XR0}$ to $\overline{XR3}$ selectively to the low level. These inverted redundancy word line selecting signals $\overline{XR0}$ to $\overline{XR3}$ are fed to a redundancy word line selecting drive signal generator PRWD.

On the basis of the aforementioned complementary internal address signals BX2, BX3 and BX10 and the word line drive signal $\phi_x$ fed from the timing generator TG, the word line selecting drive signal generator PWD forms the word line selecting drive signals X00U to X11U and X00D to X11D selectively. On the basis of the aforementioned word line drive signal $\phi_x$, inverted redundancy word line selecting signals $\overline{XR0}$ to $\overline{XR3}$ and complementary internal address signal BX10, moreover, the redundancy word line selecting drive signal generator PRWD forms the corresponding redundancy word line selecting drive signals XR0U to XR3U or XR0D to XR3D selectively.

A booster circuit VCHG accomplishes a variable boosting operation in response to the output of a sensor for sensing the fluctuations of the operating voltage, as will be described hereinafter, to generate a predetermined boosted voltage VCH exceeding the supply voltage of the circuit. This boosted voltage VCH is used as a level for selecting the aforementioned word line selecting drive signals X00U to X11U (or X00D to X11D) and redundancy word line selecting drive signals XR0U to XR3U (or XR0D to XR3D). Since the operations are accomplished at the aforementioned low temperature by generating such boosted voltage VCH, the data storage capacitors of the necessarily reduced memory cells are fully written with the data storing charges.

The X-predecoder PXD decodes the complementary internal address signals $\underline{BX4}$ to $\underline{BX9}$ sequentially 2 bits by 2 bits in combination to form the corresponding predecode signals AX450 to AX453, AX670 to AX673 and AX890 to AX893 selectively. These predecode signals are commonly fed to the individual X-decoders.

Likewise, in response to the inverted timing signal $\overline{\phi_{y1}}$, the Y-address buffer YAB fetches the Y-address signals Y11 to Y18 fed through the external terminal and holds them, when the quasi-static RAM is selected in the ordinary write or read mode. On the basis of these Y-address signals, moreover, the Y-address buffer YAB forms the complementary internal address signals $\underline{AY11}$ to $\underline{AY18}$. These complementary internal address signals $\underline{AY11}$ to $\underline{AY18}$ are fed to a Y-predecoder PYD and a Y-redundancy circuit YRAC.

This Y-redundancy circuit YRAC compares and collates, for each bit, the defective address assigned to each redundancy data line and the complementary internal address signals $\underline{AY11}$ to $\underline{AY18}$ fed through the aforementioned Y-address buffer YAB at the time of memory access. If the result is that those addresses are coincident with all bits, the corresponding redundancy data line selecting signals YR0 to YR7 are selectively set to the high level. The redundancy data line selecting signals YR0 to YR7 are fed through the Y-predecoder PYD to the individual Y-decoders.

The Y-predecoder PYD decodes the complementary internal address signals $\overline{AY11}$ to $\overline{AY18}$ sequentially 2 bits by 2 bits in combination to form the corresponding predecode signals AY120 to AY123, AY340 to AY343, AY560 to AY563, and AY780 to AY783 selectively. These predecode signals are commonly fed to each Y-decoder through the corresponding signal lines. In this embodiment, the signal lines for transmitting the aforementioned predecode signals AY560 to AY563 and AY780 to AY783 to the individual Y-decoders are commonly used as the signal lines for transmitting the aforementioned redundancy data line selecting signals YR0 to YR7. Thus, the Y-predecoder PYD is further given a function to transmit the aforementioned predecode signals AY560 to AY563 and AY780 to AY783 or the redundancy data line selecting signals YR0 to YR7 selectively to the aforementioned signal lines in response to the complementary internal control signal $\phi_{yr}$ fed from the Y-redundancy circuit YRAC.

As shown in FIG. 2, there are further provided a substrate back bias voltage generator VBBG for forming a substrate back bias voltage VBB at a negative potential on the basis of the supply voltage of the circuit, and a voltage generator HVCG for forming an internal voltage HVC set at a voltage about one half of the supply voltage of the circuit.

As shown in FIG. 3, the quasi-static RAM is equipped with eight memory arrays MARY0L and MARY0R to MARY3L and MARY3R which are divided substantially in the extending direction of the data lines. These memory arrays are individually arranged together with corresponding sense amplifiers SA0L and SA0R to SA3L to SA3R and column switches CS0L and CS0R to CS3L and CS3R symmetrically across corresponding Y-address decoders YD0 to YD3. Moreover, the sense amplifiers, column switches and Y-decoders corresponding to those memory arrays are individually arranged in vertically divided manners across corresponding X-address decoders XD0L and XD0R to XD3L and XD3R so that they are designated by adding symbols (U) and (D) in a manner to correspond to their arranged positions. In order to avoid any complicatedness, the symbols (U) and (D) will be omitted, unless especially necessary, in the following description. Of the memory arrays, moreover, the memory arrays arranged above the X-decoders will be called the upper side arrays, whereas the memory arrays arranged below the same will be called the lower side arrays.

The memory arrays MARY0L to MARY3L and MARY0R to MARY3R are selectively rendered operative if the addressed word line is selected. If, in this embodiment, the quasi-static RAM is in the ordinary write or read mode or in the auto-refresh mode, the aforementioned eight memory arrays are simultaneously rendered operative in combination of their two, i.e., MARY0L and MARY2L (or MARY0R and MARY2R) or MARY1L and MARY3L (or MARY1R and MARY3R). At this time, in each memory array, the upper side array or the lower side array is selectively rendered operative in response to the complementary internal address signal $\overline{BX10}$ of the least significant bit, and four sets of data lines are simultaneously selected from the two memory arrays in the operating state and are connected with the corresponding unit circuits of the corresponding main amplifiers MALL and MALR or MARL and MARR or write circuits DILL and DILR or DIRL and DIRR. As a result, this quasi-static RAM is constructed into the so-called "RAM of 8 bits" for inputting and outputting the stored data of 8 bits simultaneously.

In case the quasi-static RAM is in the self-refresh mode, the aforementioned eight memory arrays are rendered operative all at once, although not especially limited thereto. At this time, in each memory array, the upper side array or lower side array is selectively rendered operative in accordance with the complementary internal address signal $\overline{BX10}$ of the most significant bit so that the refresh operations for the totally eight word lines to be selectively brought into the selected state in those memory arrays are simultaneously executed. These refresh operations are executed in a self-control manner and periodically for a period of four times as long as the ordinary refresh period so that the refresh address counter RFC is sequentially updated at each time. As a result, the number of refresh operations for a unit time in the self-refresh mode is substantially reduced to a quarter so that the average current consumption of the memory array is accordingly reduced. This self-refresh operation will be described in detail hereinafter.

In the same Figure, there is shown in the memory array MARY0L one memory cell to be coupled to a word line W and a data line D.

As shown in FIG. 4, the quasi-static RAM is equipped with eight data input/output terminals 100 to 107 which are provided to correspond to input or output data of 8 bits. The quasi-static RAM is further equipped with a data input buffer DIB and a data output buffer DOB, each of which has eight unit circuits, in a manner to correspond to those data input/output terminals. These data input/output terminals 100 to 107 are coupled to the input terminals of the corresponding unit circuits of the data input buffer DIB and to the output terminals of the corresponding unit circuits of the data output buffer DOB. The data input buffer DIB is fed with a timing signal $\phi_{dic}$ from the timing generator TG, and the data output buffer DOB is fed with a timing signal $\phi_{doc}$. Here, the timing signal $\phi_{dic}$ is selectively raised to the high level, although not especially limited thereto, at the instant the input data fed through the data input/output terminals 100 to 107 have their levels fixed when the quasi-static RAM is selected in the ordinary write mode. On the other hand, the timing signal $\phi_{doc}$ is selectively raised to the high level at the instant the read signals of the selected eight memory cells have their levels fixed when the quasi-static RAM is selected in the ordinary read mode.

The less significant four unit circuits of the data input buffer DIB have their output terminals coupled individually to the input terminals of the corresponding unit circuits of write circuits DILL and DIRL, and the more significant four unit circuits of the data input buffer DIB have their output terminals coupled individually to the input terminals of the corresponding unit circuits of write circuits DILR and DIRR. Likewise, the less significant four unit circuits of the data output buffer DOB have their input terminals coupled individually to the output terminals of the corresponding unit circuits of main amplifiers MALL and MARL, and the more significant four unit circuits of the data output buffer DOB have their input terminals coupled individually to the output terminals of the corresponding unit circuits of main amplifiers MALR and MARR. The main amplifiers MALL and MALR are fed with a timing signal $\phi_{ma0}$ from the timing generator TG, and the main amplifiers MARL and MARR are fed with a timing signal $\phi_{ma1}$.

The data input buffer DIB fetches the input data to be fed through the data input/output terminals I00 to I07, in response to the aforementioned timing signal, when the quasi-static RAM is selected in the operating cycle of the write system, and writes the data in the eight memory cells to be simultaneously selected, through the corresponding unit circuits of the write circuits DILL to DIRR. On the other hand, the data output buffer DOB fetches the read signals of 8 bits to be amplified by the main amplifiers MALL to MARR, in response to the aforementioned timing signal $\phi_{doc}$ when the quasi-static RAM is selected in the operating cycle of the read system, and transmits the read signals to the outside through the corresponding data input/output terminals I00 to I07. When the timing signal $\phi_{doc}$ is at the low level, the output of the data output buffer DOB is brought into the high impedance state.

The quasi-static RAM of this embodiment takes the non-address multiplex system, as has been described hereinbefore, and is equipped with totally nineteen address input terminals A0 to A18. The quasi-static RAM is further equipped with totally sixteen memory arrays which are paired and substantially vertically halved, and each memory array is equipped with sixty four groups of totally two hundreds fifty six word lines, which are selectively brought into the selected state and four of which are grouped, and with totally one thousand and twenty four sets of complementary data lines, four sets of which are simultaneously selected. As a result, each memory array is substantially given an address space of 262,144 bits, i.e., the so-called "256 Kbits", so that the quasi-static RAM has a storage capacity of the so-called "4 Megabits".

When the quasi-static RAM is selected in the ordinary operating mode, the sixteen memory arrays are simultaneously selected substantially two by two, i.e., in the so-called "pair". Moreover, the four pairs of totally eight memory cells are selected individually from the two memory arrays to be simultaneously rendered operative, and are connected with the corresponding I/O lines. These memory cells are further connected with the corresponding unit circuits of the data input buffer DIB or data output buffer DOB through the corresponding write circuit or main amplifier.

The memory array pairs are selected in accordance with the address signals A0 and A1, and the upper or lower side array is selected in accordance with the address signal A10. As a result, one eighth of the sixteen memory arrays is selected so that the two memory arrays are simultaneously rendered operative. When the quasi-static RAM is in the self-refresh mode, as has been described hereinbefore, the aforementioned address signals A0 and A1 make no sense so that the eight upper or lower side arrays are rendered operative all at once.

Next, the address signals A4 to A9 of 6 bits are fed to the X-predecoder PXD so that they are combined in 2 bits and decoded. As a result, the corresponding predecodes AX450 to AX453 to AX890 to AX893 are selectively raised to the high level. These predecode signals are fed to the X-decoder to select the word line groups of each memory array. The address signals A2 and A3 of 2 bits are fed to the word line selecting drive signal generator PWD and are combined with the word line drive signal $\phi_x$ outputted from the word line drive signal generator $\phi$XG, so that they are fed for forming the word line selecting drive signals X00, X01, X10 and X11 selectively. As has been described hereinbefore, the word line selecting drive signals X00 to X11 are used as the boosted voltage VCH exceeding the supply voltage of the circuit. As a result, one of two hundreds fifty six word lines constituting the two memory arrays addressed in response to the aforementioned address signals A0, A1 and A10 is selected in response to the aforementioned address signals A2 to A9 of 8 bits.

Likewise, the address signals A11 to A18 of 8 bits inputted through the address input terminals A11 to A18 are used as the Y-address signals and are fed to the Y-predecoder PYD for selecting the data lines, so that they are decoded 2 bits by 2 bits in the combinations of A11 and A12, A13 and A14, A15 and A16, and A17 and A18. As a result, the corresponding predecode signals AY120 to AY123, AY340 to AY343, AY560 to AY563, and AY780 to AY783 are selectively raised to the high level. These predecode signals are further combined by the decoder tree of the Y-decoder so that individually four sets, i.e., totally eight sets of complementary data lines are selected from the two memory arrays in the operating state and are connected with the corresponding common I/O lines. Thus, the eight memory cells are selected from the memory cells of the so-called "4 Megabits" to accomplish the input/output operations of the stored data of 8 bits through the data input/output terminals I00 to I07.

Figure 5:
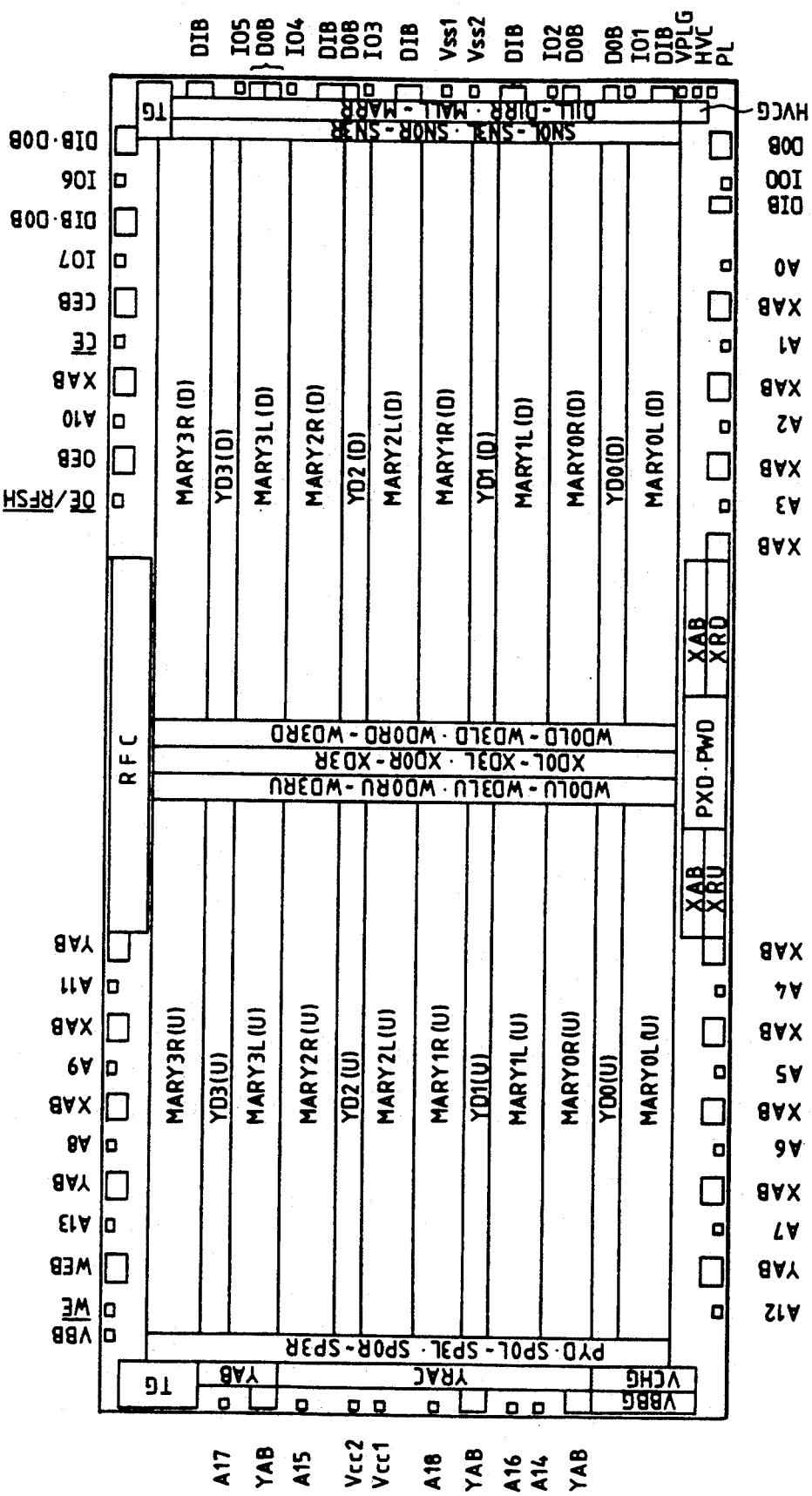
FIG. 5 is a geometric arrangement showing one embodiment of a semiconductor substrate surface of the quasi-static RAM.

FIG. 5 is a geometric arrangement diagram showing one embodiment of the aforementioned quasi-static RAM on the semiconductor substrate surface. The fundamental layout of one embodiment of the quasi-static RAM of this embodiment will be described with reference to FIG. 5. Since, in the same Figure, the semiconductor substrate is illustrated transversely from the convenience of the drawing sheet, the lefthand side of the same Figure will be called the upper side of the semiconductor substrate in the following description.

As has been described hereinbefore, the quasi-static RAM is equipped with the eight (or substantially sixteen) memory arrays MARY0L to MARY3L and MARY0R to MARY3R, which are individually divided into the upper and lower sides, and further with X-address decoders XD0L to XD3L and XD0R to XD3R, which correspond to those memory arrays, and four Y-address decoders YD0 to YD3, which correspond to the two memory arrays and are individually divided into the upper and lower sides.

The X-address decoders XD0L to XD3L and XD0R to XD3R are arranged at the central portion of the semiconductor substrate surface, and the corresponding word line drive circuits WD0LU to WD3LU (and WD0LD to WD3LD) and WD0RU to WD3RU (and WD0RD to WD3RD) are arranged at the upper and lower sides, respectively. Across those X-selectors, moreover, the corresponding memory arrays MARY0L to MARY3L and MARY0R to MARY3R are arranged in the so-called "longitudinal type", in which they interpose the corresponding Y-decoders YD0 to YD3 and extend the word lines vertically. Although not shown, moreover, the corresponding sense amplifiers SA0L to SA3L and SA0R to SA3R and column switches CS0L to CS3L and CS0R to CS3R are individually arranged in the vicinity of the Y-address decoders YD0 to YD3.

Over the memory arrays MARY0L to MARY3L and MARY0R to MARY3R, there are arranged the pre-Y-address decoders PYD, the Y-address redundancy control circuit YRAC and so on. Below those memory arrays, on the other hand, there are arranged the main amplifiers MALL to MARR, the write circuits DILL to DIRR and so on.

The semiconductor substrate surface is arranged at each side with the bonding pads so as to avoid the positions adjacent to the individual corners of the semiconductor substrate surface and the positions adjacent to the central portion of the lefthand and righthand sides. In the vicinity of those bonding pads, moreover, there are arranged the corresponding unit circuits of the X-address buffer XAB and the Y-address buffer YAB, and the data input buffer DIB and the data output buffer DOB.

Figure 27:
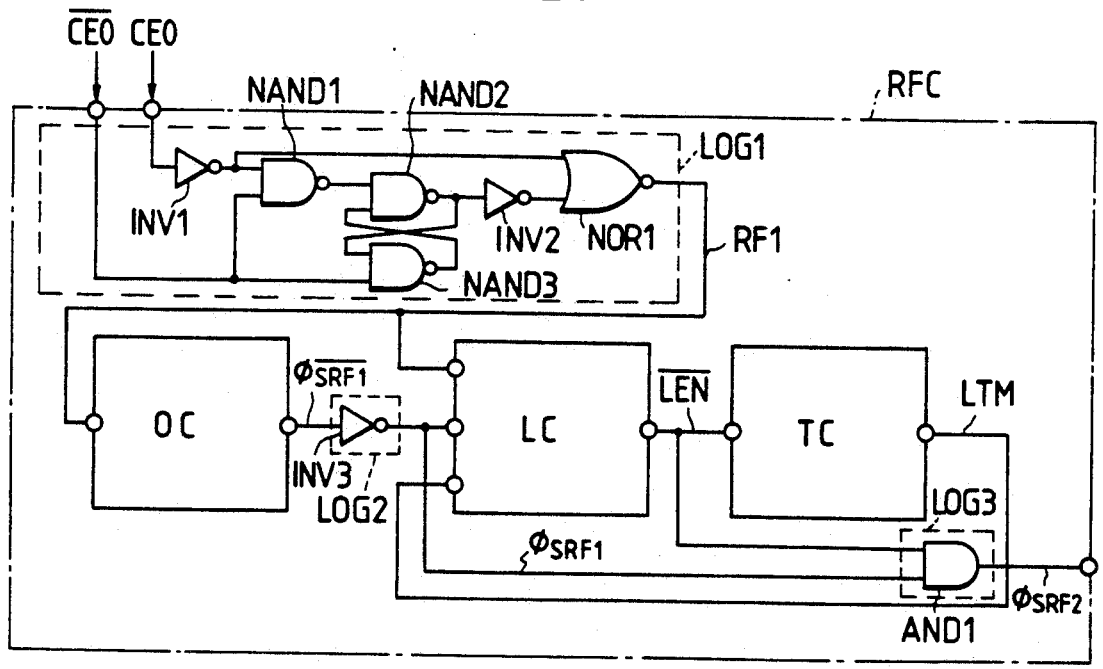
FIG. 27 is a block diagram showing one embodiment of a refresh counter according to the present invention.

FIG. 27 is a block diagram showing one embodiment of the refresh counter RFC according to the present invention. This refresh counter RFC is constructed of logic circuits LOG1, LOG2 and LOG3, an oscillator circuit OC, a low-temperature limiter circuit LC and a timer circuit TC. The detailed descriptions of the individual operations of the oscillator circuit OC, the low-temperature limiter circuit LC and the timer circuit TC will be accomplished with reference to the Drawings.

The logic circuit LOG1 is composed of inverters INV1 and INV2, NAND circuits NAND1 to NAND3, and a NOR circuit NOR1. The inverter circuit INV1 is fed with the output signal OE0 of the input buffer OEB. The NAND circuit NAND1 is fed with the inverted output signal $\overline{CE0}$ of the input buffer CEB and the output signal of the inverter circuit INV1. The NAND circuits NAND2 and NAND3 take the flip-flop shape, in which the NAND circuit NAND2 is fed as its one input with the output signal of the NAND circuit NAND1 and as its other input with the output signal of the NAND circuit NAND3. Moreover, the NAND circuit NAND3 is fed as its one input with the output signal of the NAND circuit NAND2 and as its other input with the inverted output signal $\overline{CE0}$ of the input buffer CEB. The inverter circuit INV2 is fed with the output signal of the NAND circuit NAND2. The NOR circuit NOR1 is fed as its input with the output signal of the inverter circuit INV1 and as its other input with the output signal of the inverter circuit INV2. Moreover, the NOR circuit NOR1 outputs the signal RF1. The oscillator circuit OC is fed with the signal RF1 from the logic circuit LOG1 to output the signal $\Phi$ SRF1. The logic circuit LOG2 is the inverter circuit INV3 and inverts the output signal $\overline{\Phi\,SRF1}$ coming from the oscillator circuit OC and outputs it to the low-temperature limiter circuit LC and the logic circuit LOG3. The low-temperature limiter circuit LC is fed with the output signal RF1 of the logic circuit LOG1, the output signal $\Phi$ SRF1 of the logic circuit LOG2, and the output signal LTM of the timer circuit TC. This timer circuit TC is fed with the output signal $\overline{LEN}$ of the low-temperature limiter circuit LC to output the signal LTM. The logic circuit LOG3 is the AND circuit AND1, which is fed as its one input with the output signal $\Phi$ SRF1 of the logic circuit LOG2 and as its other input with the output signal $\overline{LEN}$ of the low-temperature limiter circuit LC. Moreover, the AND circuit AND1 outputs the signal $\Phi$ SRF2.

Figure 6:
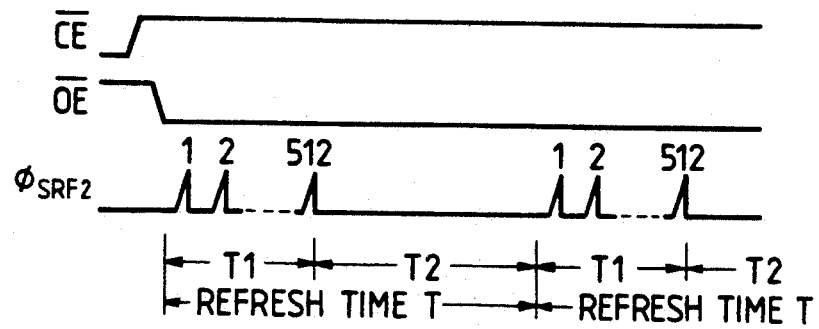
FIG. 6 is a timing chart for explaining the refresh operation according to the present invention.

FIG. 6 is a timing chart of one embodiment for explaining the self-refresh operation of the aforementioned RAM.

In this embodiment, as has been described hereinbefore, the totally eight word lines are simultaneously selected by the single operation to refresh the 8,192 memory cells. Thus, the RAM has a storage capacity of about 4 Megabits in its entirety so that one round of self-refresh operations is composed of 1st to 512-th 512 cycles. In this embodiment, one round of self-refresh operations is continuously accomplished with the pulses formed by a later-described temperature-compensated oscillator circuit for a self-refresh time T1 which is independent from the temperature change, i.e., the data holding characteristics of the memory cells. Moreover, a pause time T2 is set by the timer circuit using a time constant circuit corresponding the data holding characteristics of the memory cells, as will be described hereinafter. Therefore, the substantial refresh period T of this embodiment is determined by the aforementioned times T1+T2. After lapse of the aforementioned pause time T2, a next refresh period is started, and the self-refresh operations (T1) from the 1st to 512-th cycles are restarted. After this, the pause time T2 is entered. Similar cycles are subsequently repeated to accomplish the self-refresh operations.

The aforementioned self-refresh mode is started, with the chip enable signal $\overline{CE}$ being fixed at the high level, under a condition that the output enable signal $\overline{OE}$ is fixed at the low level continuously for a constant time ($t_{FAS}$) so that it may be discriminated from the auto-refresh mode.

Figure 7:
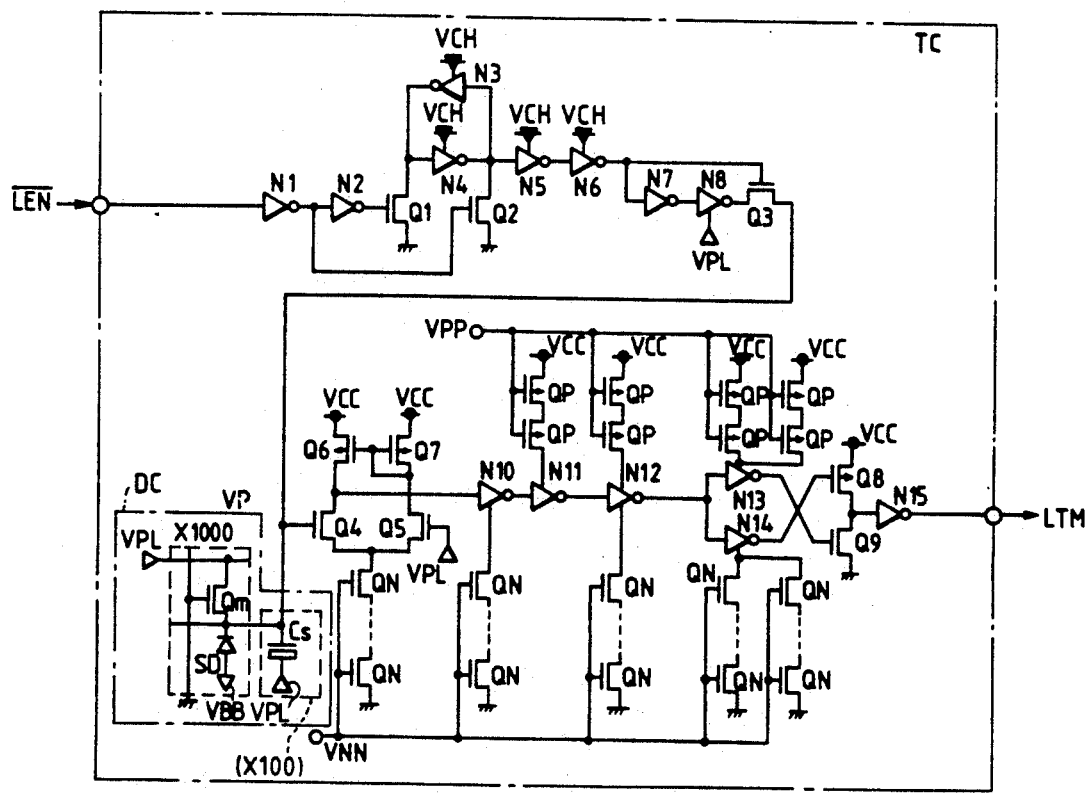
FIG. 7 is a circuit diagram showing one embodiment of a timer circuit to be used in the self-refresh operation according to the present invention.

FIG. 7 is a circuit diagram showing one embodiment of the timer circuit TC for setting the aforementioned pause time T2.

In this embodiment, dummy cells formed under the same condition (or process) as that of the memory cells are used to provide a time constant circuit corresponding to the amount of data storing charges of the memory cells. Unlike the memory cells, however, the dummy cells use address selecting MOSFETs Qm as the time constant circuit. Of the dummy cells corresponding to one thousand memory cells, the address selecting MOSFETs Qm are connected in parallel, although not especially limited thereto. Specifically, the gate electrode corresponding to the word line is commonly connected with the earth potential point of the circuit, and the drain corresponding to the data line is connected with a plate voltage VPL. Moreover, the source to be connected with the data storing capacitor is connected with a separately provided capacitor Cs. This capacitor Cs is given a capacity corresponding to the composed capacity of about one hundred data storing capacitors. As described above, the number of the address selecting MOSFETs Qm corresponding to about one thousand memory cells are connected in parallel, whereas the capacity of the capacitor Cs is set at the value of about one hundred data storing capacitors, as smaller by one figure than the memory cells. This reason will be described in the following. Of the memory cells formed in the memory array MARY, the data storage time of the memory cells of the worst case is worse by about one figure than the data storage time of average memory cells. If the address selecting MOSFETs Qm corresponding to about one thousand memory cells are connected in parallel, the sum of the leakage currents having passed through their sources or channels is an averaged one. For these leakage currents, a time constant circuit corresponding to the data holding characteristics of the memory cells of the aforementioned worst case can be equivalently obtained by connecting the capacitors Cs which are smaller by one figure, as described above. By connecting in parallel the address selecting MOSFETs Qm corresponding to as many as one thousand memory cells, moreover, the leakage currents of the average address selecting MOSFETs Qm can be established for process dispersions. Since as many as one hundred capacitors Cs are used, as described above, their capacity can be increased to such an extent as can neglect the input capacity and wiring capacity of the voltage comparator for monitoring the voltage level. Thus, it is possible to obtain a time constant circuit which has a discharge time constant approximate to the memory cells of the worst case formed in the memory array MARY.

The precharge circuit for the aforementioned capacitors Cs has its source and drain not formed over the semiconductor substrate but exemplified by a poly-silicon layer which is formed over a field insulating film having a relatively large thickness. This is because the precharge MOSFET Q3 would cause its leakage current, if its source and drain were formed of a diffusion layer, to influence the aforementioned set time constant.

In case the MOSFET Q3 is made of an N-channel MOSFET, the gate voltage to be used is not the supply voltage VCC but a boosted VCH. As a result, the capacitor Cs can be precharged at a high level as the supply voltage VCC generated by an inverter circuit N8. Incidentally, if the inverter circuit N8 is at the low level such as the earth potential of the circuit with the MOSFET Q3 being in the OFF state, the holding voltage of the capacitor Cs is applied between the source and drain of the MOSFET Q3 to increase the leakage current through the channel. In this embodiment, therefore, a plate voltage VPL is used as the operating voltage of the inverter circuit N8 at the low level side. Since the plate voltage VPL is set at VCC/2, the inter-channel leakage current of the MOSFET Q3 can be reduced by three to five figures. As a result, the leakage current of the precharging MOSFET can be substantially ignored to provide a highly accurate time constant.

A control signal $\overline{LEN}$ is a precharge control signal, and inverter circuits N1 and N2, MOSFETs Q1 and Q3 made receptive of their complementary output signals, and inverter circuits N3 and N4 of latch shape to be operated by the boosted voltage VCH constitute altogether a level converter to convert the precharge control signal $\overline{LEN}$ at the VCC level into signals at a level corresponding to the boosted voltage VCH. These converted signals are fed as the gate control signals of the aforementioned precharge MOSFET Q3 through inverter circuits N5 and N6. Then, the output signal of the inverter circuit N6 is outputted as the precharge voltage through inverter circuits N7 and N8.

MOSFETs Q4 and Q5 are differentially amplifying MOSFETs, the MOSFET Q4 has its gate fed with a voltage VP of the aforementioned time constant circuit whereas the MOSFET Q5 has its gate fed with the plate voltage. In order to reduce the power consumption of the comparators, in this embodiment, a plurality of N-channel MOSFETs QN connected with the shared sources of the aforementioned differential MOSFETs Q4 and Q5 are connected in series to establish a fine operating current. Moreover, in order that the differential amplifier may operate only in the aforementioned self-refresh mode, the gate is fed with the control voltage VNN so that the fine current may flow in the aforementioned MOSFETs QN in the self refresh mode. The aforementioned MOSFETs Q4 and Q5 are equipped at their drains with P-channel MOSFETs Q6 and Q7 in the current mirror mode, which act as the loads.

For the low power consumption, as described above, the gain of the differential amplifier is reduced. Therefore, this differential amplifier has its output signal amplified by inverter circuits N10 to N12 which are connected in tandem. Of these inverter circuits N10 to N12, too, the inverter circuits N10 and N12 are equipped with the N-channel MOSFETs QN acting as the aforementioned constant current source, and the inverter circuits N11 and N12 are equipped with similar P-channel MOSFETs QP. Moreover, the inverter circuit N12 has its output signal transmitted through inverter circuits N13 and N14 to the gates of an N-channel MOSFET Q9 and a P-channel MOSFET Q8, which constitute together a CMOS output circuit. The inverter circuit N13 for generating the drive signal of the N-channel MOSFET Q9 is equipped in parallel with a constant current source MOSFET QP at the side of the supply voltage VCC, and the inverter circuit N14 for generating the drive signal of the P-channel MOSFET Q8 is equipped in parallel with the constant current sources QN at the earth potential side.

The N-channel MOSFETs QN and QP, which are disposed in the aforementioned inverter circuits N10 to N14 to constitute the constant current sources, are fed at their gates with control voltages VNN and VPP for turning those MOSFETs QN and QP on when in the self-refresh mode, i.e., when the timer circuits are operated.

Figure 8:
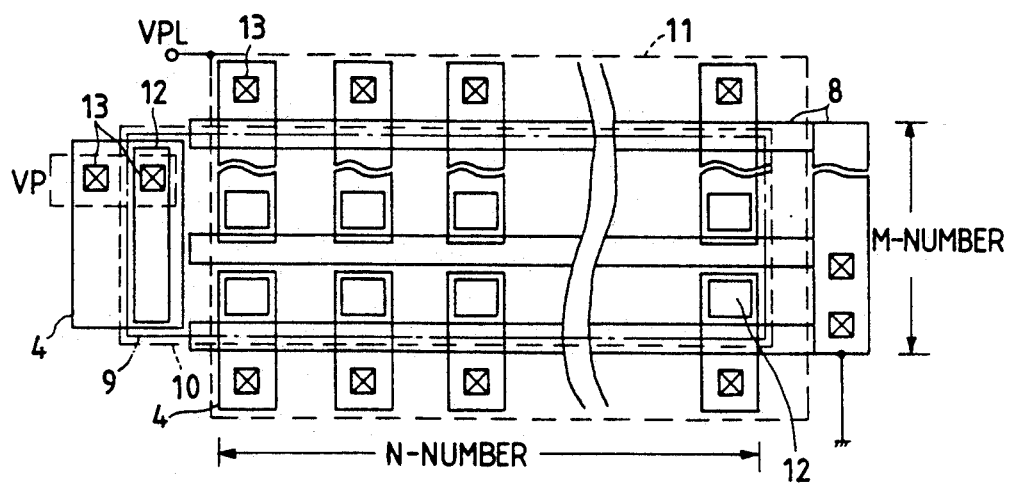
FIG. 8 is a pattern diagram showing one embodiment of dummy cells to be used in the timer circuit.

FIG. 8 is a pattern diagram showing one embodiment of a dummy cell to be used in the aforementioned timer circuit. In this embodiment, the dummy cells are arrayed transversely in an N-number and longitudinally in an M-number so that an $M \times N$ number of dummy cells are arranged as a whole, although not especially limited thereto. In the pattern of the memory cells formed in the memory array, word lines formed of a diffusion layer (e.g., source and drain) and a first poly-silicon layer 8 are arranged zigzag for arranging the memory cells in a high density. Since, however, at most about one thousand dummy cells may be formed in the timer circuit, as has been described hereinbefore, the pattern is formed of linear source and drain (or diffusion layer L) and word lines. The word line (i.e., the first poly-silicon layer) to be connected with the gate of the address selecting MOSFET Qm is made common with the first poly-silicon layer 8 at the righthand side and is connected with the earth potential point of the circuit.

The address selecting MOSFETs Qm have their drains connected commonly with the first aluminum layer 11, as indicated by broken lines, by contacts 13. This aluminum layer 11 is connected with the plate voltage VPL.

The data storing capacitor of the dummy cell is formed in a region defined by two word lines and has its one electrode formed of a second poly-silicon layer 9, as indicated by single-dotted lines in the same Figure, and a third poly-silicon layer 10, as indicated by dotted lines in the same Figure. The capacitor of the memory cell formed in the memory array has its second poly-silicon layer 9 shorted to the source of the address selecting MOSFET Qm by a contact 12, but formed of one common electrode in this embodiment because a separately provided capacitor is used. Moreover, the aforementioned second poly-silicon layer 9 is shorted at the lefthand side of the same Figure to the diffusion layer through the contact 12. The layer 9 is extracted to the aluminum layer 11 through the contact 13. The third poly-silicon layer 10 is shorted to that aluminum layer 11 by the contact layer 13 so that it is used as the shared source electrodes of the address selecting MOSFETs Qm. With this source electrode, there is connected the aforementioned capacitor Cs which is separately provided.

Figure 9:
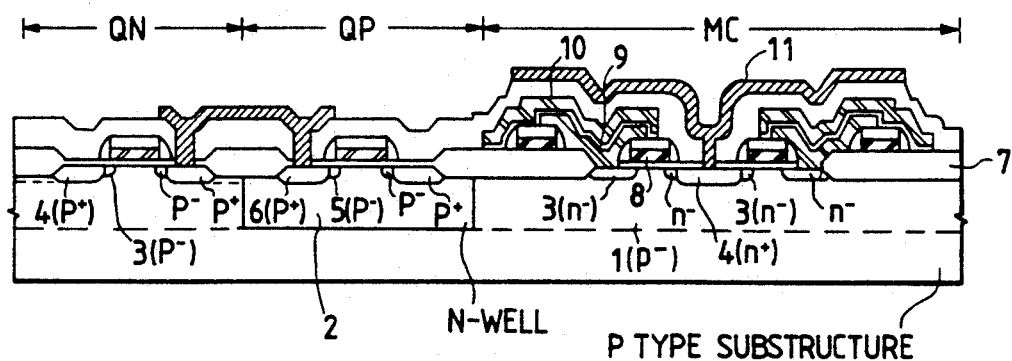
FIG. 9 is an element structure section showing one embodiment of a memory cell having an STC structure and MOSFETs constituting a CMOS circuit.

FIG. 9 is an element structure section showing one embodiment of the memory cell MC of the STD structure and the N-channel MOSFET QN and P-channel MOSFET QP constructing the CMOS circuit.

Two memory cells are arranged symmetrically across an $n^+$-type layer constituting the address selecting MOSFET Qm to form the two address selecting MOSFETs Qm using the first poly-silicon layer 8 as the word lines. The address selecting MOSFET Qm has its source connected with the second poly-silicon layer 9 constituting the data storing capacitor. The word line (i.e., the first poly-silicon layer 8) of the memory cell adjacent to the aforementioned ones runs in parallel over a thick field insulating film dividing the element forming region. The drain shared between the aforementioned two address selecting MOSFETs Qm is connected with the first aluminum layer 11 constituting the data lines. Moreover, the N-channel MOSFETs QN and the P-channel MOSFETs QP constituting the CMOS circuit have their gate electrodes made of the first poly-silicon layer 8 and their drain outputs shared by the first aluminum layer 11, although especially limited thereto.

In the aforementioned dummy cells to be used in the timer circuit, the shorting between the second poly-silicon layer 9 and the third poly-silicon layer 10 or the formation of a dielectric film of the capacitor is omitted so that no capacitor may be formed. Moreover, the first aluminum layer 11 is different from that of the aforementioned memory cell MC in that it is fed with the plate voltage VPL to be fed to the third poly-silicon layer 10, in that the first poly-silicon layer 8 acting as the word lines is commonly connected with the earth potential point of the circuit, and in that the second and third poly-silicon layers 9 and 10 constituting the capacitor are used as wiring lines for sharing the sources of the address selecting MOSFETs Qm.

In the timer circuit thus constructed, the address selecting MOSFETs Qm feeds a leakage current of about one thousand cells. If, in this case, one or two leakage currents are higher by one figure due to the process dispersions, they give rise to at most several percentage of leakage current as a whole so that they establish an average leakage current. Thus, a time constant matching the memory cells of the worst case can be achieved by setting the capacity of the capacitors Cs at that of about 100 cells. As a result, the data holding amount of the memory cells can be indirectly monitored by comparing the voltages VP precharged in the capacitors Cs by means of the comparators.

Thus, it is possible to set the refresh period T matching the process dispersion and temperature dependency of such memory cells of the worst case of the actual memory cells as have a short data holding time.

Figure 10:
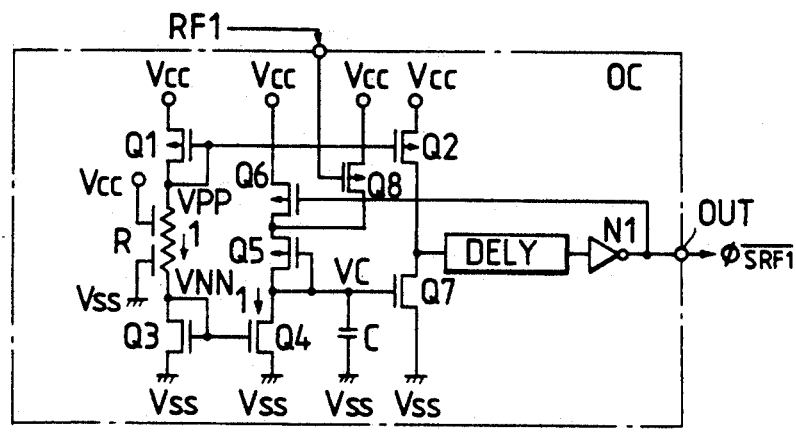
FIG. 10 is a circuit diagram showing one embodiment of an oscillator for setting the self-refresh time.

FIG. 10 is a circuit diagram showing one embodiment of an oscillator circuit for determining the aforementioned self-refresh time T1. The circuit symbols attached to the individual circuit elements of the same Figure are partially overlapped with those of FIG. 7 but should be understood to be individually different. These relations are similar in the following circuit diagrams.

The oscillator circuit of this embodiment establishes an operating current by using a high resistor R so as to reduce the power consumption and compensate the temperature. Between the supply voltage Vcc and the earth potential Vss of the circuit, there are connected the P-channel MOSFET Q1 of a diode shape, a high resistor R and the N-channel MOSFET Q3 having a diode shape like the above one. This makes it possible to feed a fine constant current i to the high resistor R. The aforementioned N-channel MOSFET Q3 is equipped with the N-channel MOSFET Q4 in the current mirror shape so that the capacitor C may be discharged with its drain current (or mirror output current) i. Let it be assumed that the MOSFETs Q3 and Q4 are equally sized. The aforementioned capacitor C is equipped with a charging path which is composed of the P-channel MOSFET Q5 and the P-channel MOSFET Q6 of the diode shape. The P-channel MOSFET Q8 is connected between the node of the P-channel MOSFETs Q5 and Q6 and the supply voltage Vcc and is fed at its gate with the signal RF1 which is generated by the logic circuit LOG1 described with reference to FIG. 27. The holding voltage VC of the capacitor C is fed to the gate of the MOSFET Q7. This MOSFET Q7 is equipped at its drain with the P-channel load MOSFET Q2 which is connected in the current mirror shape with the aforementioned P-channel MOSFET Q1. The drain output of the aforementioned MOSFET Q7 is fed through a delay circuit DELY and the inverter circuit N1 to the gate of the aforementioned P-channel MOSFET Q6. Moreover, the inverter circuit N1 transmits periodic pulses (or oscillating signal $\overline{\Phi_{SRF1}}$) from an output terminal OUT, although especially limited thereto.

Figure 11:
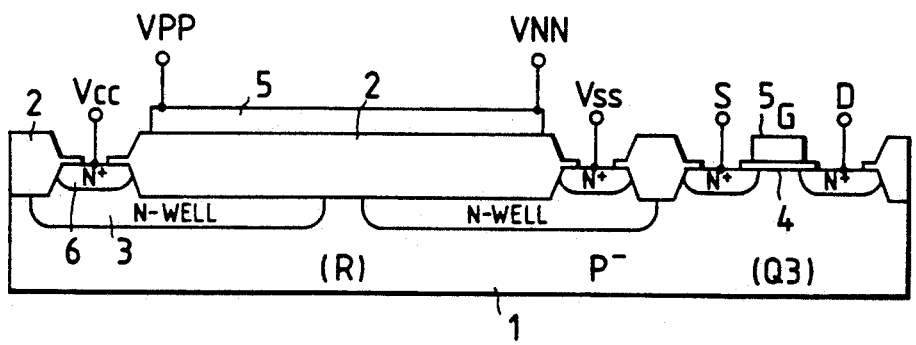
FIG. 11 is an element structure section showing one embodiment of major elements to be used in the oscillator.

In this embodiment circuit, nothing but the current proportional to the fine constant current i established by the high resistor R flows for the operating period except a short one, for which the MOSFET Q7 is OFF, so that the circuit can have its power consumption reduced remarkably and can perform stable oscillations with no temperature dependency. In order to prevent the influences from the power fluctuations and the large fluctuations of the earth potential, the element structure is so made as is shown in FIG. 11. For example, the resistor R is formed of a first poly-silicon layer 5 which is prepared at the same step as that of the gate electrode G of the MOSFET Q3. Nevertheless, the poly-silicon layer 5 forming the resistor R is not doped with an impurity for enhancing the conductivity as in the gate electrode G of the MOSFET Q3, so that it may have a high sheet resistance. The resistor R is formed over a field insulating film 2 which is made thick. Below this field insulating film 2 and on the surface of the semiconductor substrate, there is formed an N-type well region 3 which is halved generally at the central point of the poly-silicon layer forming the resistor R. The well region of the lefthand half of the resistor R to be connected with the P-channel MOSFET Q1 is supplied with the supply voltage Vcc through an $N^+$-type region 6 which is formed at the same step as that of the source S and drain D of the MOSFET Q3. The well region corresponding to the righthand half of the aforementioned resistor R to be connected with the N-channel MOSFET Q3 is supplied with the earth potential Vss of the circuit through the $N^+$-type region 6 which is prepared at the same step as that of the source S and drain D of the MOSFET Q3.

Incidentally, reference numeral 4 designates a thin gate insulating film for constituting the MOSFET.

In FIG. 10, the upper half of the resistor R constitutes a parasitic capacitor between itself and the supply voltage Vcc, and the lower half of the resistor R constitutes a parasitic capacitor between itself and the earth potential Vss of the circuit. As a result, for example, if the power supply fluctuates to drop the supply voltage Vcc abruptly, the potential VPP of the resistor R at the side of the P-channel MOSFET Q1 is abruptly dropped by the aforementioned parasitic capacitor. Thus, the P-channel MOSFET Q1 remains in the ON state. As a result, the oscillator circuit can continue its stable oscillations without being influenced by the supply bump.

Even if the earth potential Vss is abruptly raised by some cause, the potential VNN of the resistor R at the side of the N-channel MOSFET Q3 accordingly rises abruptly. Thus, the N-channel MOSFET Q1 remains in the ON state. As a result, the oscillator circuit can continue its oscillations without being influenced by the abrupt fluctuations of the earth potential.

In these ways, the oscillator circuit can continue its stable operations without being influenced by the fluctuations of the supply voltage and the earth potential. Thus, the time period necessary for the refresh period can be set without considering the fluctuations of the power supply or the temperature change as the oscillation frequency.

Thanks to the combination of the stable oscillator circuit OC and the timer circuit TC having the aforementioned temperature dependency, the self-refresh operation can be accomplished for the long period optimum for the activity of the memory cells so that the power consumption on standby can be remarkably reduced. As a result, the small-sized battery can have a longer lifetime for backup operations.

Figure 12:
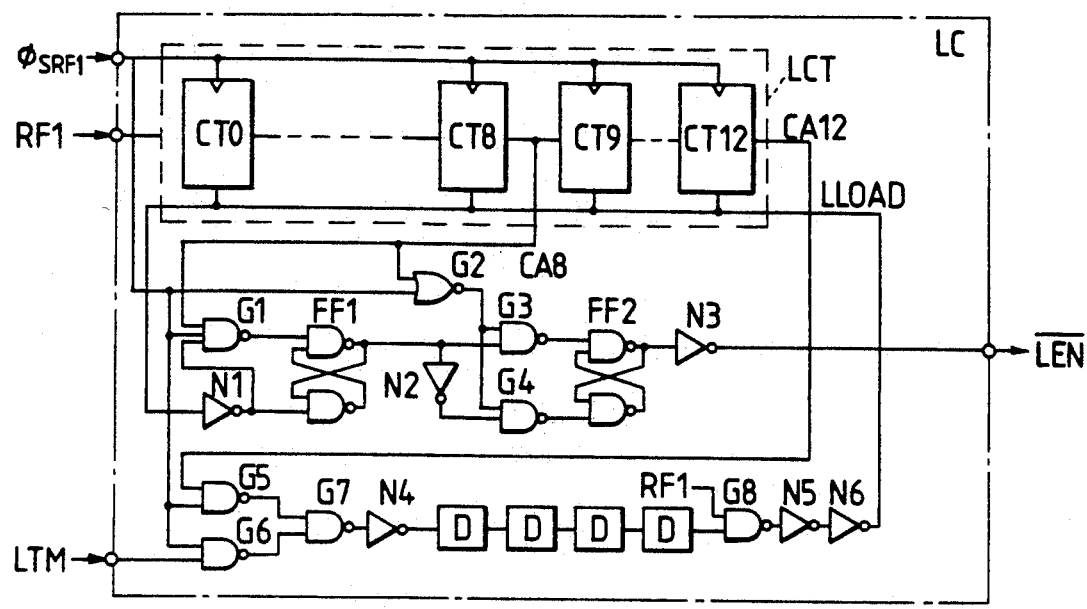
FIG. 12 is a circuit diagram showing one embodiment of a low-temperature limiter to be used for the self-refresh operation according to the present invention.

FIG. 12 is a circuit diagram showing one embodiment of a low-temperature limiter circuit LC.

In the self-refresh system of the foregoing embodiment, the timer circuit TC shown in FIG. 7 has its timer time elongated extremely at a low temperature. In the memory cells, on the contrary, the leakage current of the address selecting MOSFET Qm is reduced to correspond to the temperature drop, but the overall leakage current is covered and not reduced so much by the action of other leakage current paths. If, therefore, the refresh period T is determined exclusively by the aforementioned timer circuit, the temperature dependency of this timer circuit fails to correspond linearly to that of the memory cells, and the refresh period T may be too long to hold the stored data of the memory cells.

Thus, there is provided a low-temperature limiter circuit LC, as shown in FIG. 12.

The counter circuit is composed of binary counters CT0 to CT12 of 13 bits. These counters are fed with oscillating pulses $\phi_{srf}$ of the oscillator circuit for the self-refresh and the self-refresh signal RF1. The counter CT8 has its output signal CA8 used for detecting the end of the self-refresh time T1 of 1st to 512-th cycles. Specifically, at the 256-th cycle, the counter CA8 takes the high level, which is latched in a flip-flop circuit FF1. If the counter CA8 takes the low level at the 513-th cycle, a flip-flop circuit FF2 is set to generate a precharge signal $\overline{LEN}$ of the aforementioned timer circuit TC. These precharge operations are continued till the counter CA8 takes again the high level to start the timer circuit TC substantially.

Since, in the normal operation, the timer circuit TC establishes the output signal LTM, a signal LLOAD for cleaning the counter circuit through the gate circuits G6 and G7, the inverter circuit N4 and a delay stage D is generated so that the self-refresh operation is entered. Moreover, the output signal LTM from the timer circuit is drastically delayed at a low temperature. If the output signal CA12 of the final stage CT12 is raised to the high level before the delay, a signal LLOAD for clearing the counter circuit through the gate circuits G5 and G7, the inverter circuit N4 and the delay stage D is generated. As a result, the upper limit period of the refresh period T is determined at the low temperature by the aforementioned low-temperature limiter so that the refresh can be accomplished before the data of the memory cells are lost.

Figure 13:
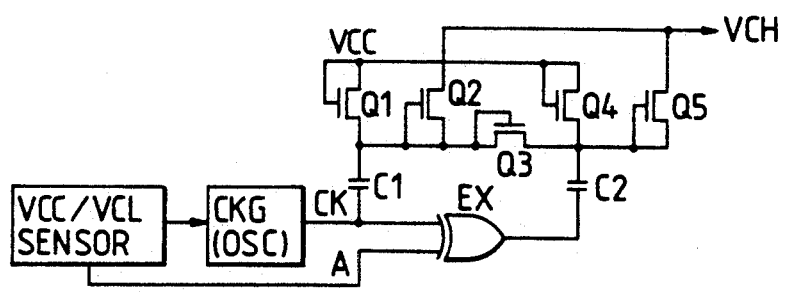
FIG. 13 is a circuit diagram showing one embodiment of a variable booster according to the present invention.

FIG. 13 is a circuit diagram showing one embodiment of the variable booster circuit according to this invention.

The aforementioned PSRAM may be operated, while being backed up by the battery, by a battery voltage VCC as low as about 1.5 V. At this time, what can be boosted by a twice booster circuit is 2 VCC−2 Vth (wherein Vth is the threshold voltage of the MOSFET) so that the condition of 2 VCC−2 Vth≧VCC+Vth cannot be satisfied. More specifically, if the supply voltage VCC is set at 1.5 V and if the threshold voltage age Vth of the MOSFET is set at 0.6 V, the boosted voltage is calculated by 3−1.2=1.8 V, which is lower than the necessary level of 1.5+0.6=2.1 V.

In this embodiment, therefore, the supply voltage VCC or the boosted voltage VCH is detected by the sensor circuit to switch the boosted voltage between twice and thrice.

The periodic pulses CK generated by a pulse generator CKG (or oscillator circuit OSC) are caused to establish an about twice boosted voltage by a capacitor C1 and the MOSFET Q1 of the diode shape. Specifically, if the pulses CK are at the low level, the capacitor C1 is charged up by the supply voltage VCC through the MOSFET Q1 of the diode shape. Next, the boosted voltage of 2 VCC+Vth is outputted from the output side of the capacitor C1, in which the pulses CK are raised from the low level to the high level (i.e., VCC). This boosted voltage of 2 VCC+Vth is transmitted to the boosted output terminal VCH through the MOSFET Q2 of the diode shape. Between the boosted output terminal VCH and the earth potential point of the circuit, there is connected a not-shown voltage holding capacitor, which has its boosted voltage VCH set at 2 VCC−2 Vth, as has been described hereinbefore.

The aforementioned pulse output and a sensor output A are fed to an exclusive logic sum circuit EX. This exclusive logic sum circuit EX is also equipped at its output side with a twice booster circuit which is composed of a capacitor C2 similar to the aforementioned one and the MOSFETs Q4 and Q5 of the diode shape. Between the two booster circuits, there is connected the MOSFET Q3 of the diode shape. In other words, the output side voltage of the aforementioned capacitor C1 is transmitted to the output side electrode of the capacitor C2 through the MOSFET Q3 of the diode shape.

The sensor output A is given the logic "0" if the supply voltage VCC or the boosted voltage is relatively high. As a result, a coincidence signal at the low level is outputted, if the pulses CK take the logic "0" at the low level, and an incoincidence signal at the high level is outputted if the pulses CK take the logic "1" at the high level. Thus, if the sensor output A is at the logic "0", pulses in phase with the input pulses CK are outputted from the output side of the exclusive logic sum circuit EX. Therefore, the aforementioned two twice booster circuits operate likewise to generate the aforementioned twice boosted voltage of 2 VCC-2 Vth. At this time, the MOSFET Q3 of the diode shape is in the OFF state because its cathode and anode sides are always at the equal potential.

If the supply voltage VCC or the boosted voltage drops to the aforementioned low voltage, the sensor circuit detects the drop to change the output signal from the logic "0" to the logic "1". As a result, the sensor circuit outputs the incoincidence signal at the high level, if the pulses CK are the logic "0" at the low level, and the incoincidence signal at the low level if the pulses CK are the logic "1" at the high level. If the sensor output A is thus changed to the logic "1", pulses in phase opposed to the input pulses CK are outputted from the output side of the exclusive logic sum circuit EX. Therefore, when the pulses CK take the high level to output the twice boosted voltage from the capacitor C1, the capacitor C2 is charged up through the MOSFET Q3 of the diode shape. If the pulses CK are given the low level, the capacitor C1 is precharged like before, and the thrice boosted voltage of 3 VCC-2 Vth is generated from the capacitor C2 driven with the pulses in the opposite phase and is transmitted to the output terminal VCH through the MOSFET Q5 of the diode shape. Thus, the variable booster circuit of this embodiment can raise the boosted voltage VCH finally to 3 VCC-3 Vth.

For example, if the supply voltage VCC is set at 1.5 V like before and if the threshold voltage Vth of the MOSFET is set at 0.6 V, the boosted voltage can be raised to 4.5−1.8=2.7 V. Since the necessary boosted voltage is 1.5+0.6=2.1 V under the above-specified conditions, a clamping MOSFET of the diode shape may be connected between the supply voltage VCC and the boosted output VCH to prevent the boosted voltage from rising more than necessary.

Figure 14:
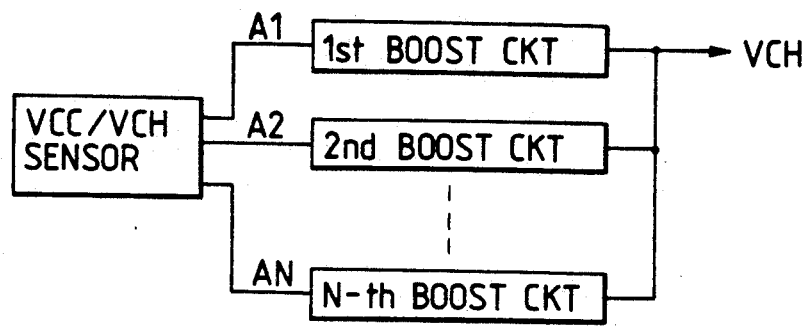
FIG. 14 is a block diagram showing another embodiment of the variable booster according to the present invention.

FIG. 14 is a block diagram showing another embodiment of the variable booster circuit.

In this embodiment, there are sequentially prepared an N number of circuits—a first boost circuit (i.e., twice booster circuit), a second boost circuit (i.e., thrice booster circuit), - - - , and an N-th boost circuit (i.e., (N+1) times booster circuit), the necessary one of which is operated to establish the boosted voltage VCH in a manner to correspond to the supply voltage VCC or the boosted voltage at that time by sensor outputs A1 to AN generated by the sensor circuits.

These sensor circuits may either generate the aforementioned sensor outputs A and A1 to AN by comparing the absolute values of the voltage VCC or VCH with a predetermined reference voltage or receive the relative voltage difference between the supply voltage VCC and the boosted voltage VCH to generate an output signal for setting the difference voltage to a desired level.

Figure 15:
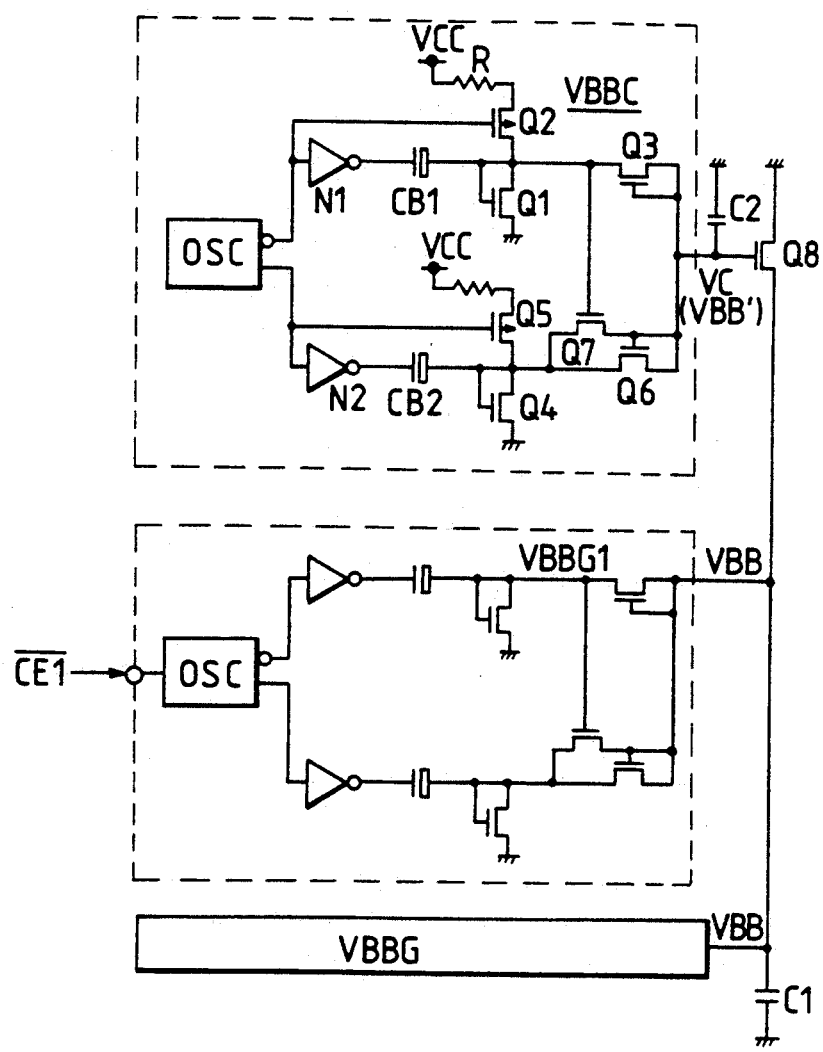
FIG. 15 is a circuit diagram showing one embodiment of the substrate voltage generator according to the present invention.

FIG. 15 is a circuit diagram showing one embodiment of the substrate voltage generator according to this invention.

In the PSRAM of the foregoing embodiment, the supply voltage VCC in the normal operation is set at a relatively high voltage such as about 5 V or 3.5 V and at a low voltage such as 1.5 V when in the battery backup operation. In this case, the operating voltage of the PSRAM is abruptly dropped from the high voltage of 5 V or 3.5 V to 1.5 V. The substrate bias voltage has to be changed to follow such change of the supply voltage. This is because the threshold voltage of the MOSFET is left at a relatively high potential by the substrate effect if the substrate voltage remains at the relatively high bias voltage generated under the high supply voltage. Therefore, the MOSFET might become inoperative, if only the operating voltage were at the aforementioned low voltage, to effect no refresh operation.

It is, therefore, conceivable to form a leakage current path between the substrate and the earth potential point of the circuit so that the substrate bias voltage may be changed to follow the change in the supply voltage. If the responsiveness of the substrate bias voltage to the supply voltage change is to be enhanced, a leakage current having a relatively high level always has to be fed to increase its consumption rate. At the same time, a substrate voltage generator having a high current feeding ability has to be formed to make it necessary to use elements of large size so that the circuit scale is accordingly enlarged.

The substrate voltage generator of this embodiment contemplates to make it possible to change the substrate potential promptly in response to the change in the supply voltage with increasing neither the current consumption nor the circuit scale.

In this embodiment, there is newly added a control voltage generator VBBC for generating a control voltage VC (VBB') changing with the supply voltage VCC.

Specifically, the control voltage generator VBBC has basically the same circuit structure as that of a substrate voltage VBBG, as will be described hereinafter. The control voltage generator VBBC is required to generate only the control voltage VC and may be given a low current feeding ability. The control voltage generator VBBC has an element number substantially equal to that of the substrate voltage generator VBBG but is composed of elements of small sizes so that its substantial circuit scale (or occupied area) can be made small.

Inverted pulses generated by an oscillator circuit OSC are transmitted through the inverter circuit N1 to one electrode of a capacitor CB1. A MOSFET Q1 of a diode shape is connected between the other electrode of the capacitor CB1 and the earth potential of the circuit. With the supply voltage VCC, there are connected in series a resistance element R having a relatively high resistance for feeding a leakage current and a P-channel MOSFET Q2. This series connection is connected with the node between the aforementioned capacitor CB1 and the MOSFET Q1 of the diode shape. The MOSFET Q2 is fed at its gate with the inverted pulses of the aforementioned oscillator circuit OSC. The negative voltage generated by the capacitor CB1 is transmitted through the MOSFET Q3 of the diode shape to the capacitor C2 (or the gate capacitor of the substrate voltage controlling MOSFET Q8) for generating the control voltage VC.

For the non-inverted pulses of the oscillator circuit OSC, there are provided a capacitor CB2, MOSFETs Q4 and Q6 of the diode shape, and the high resistor R and the P-channel MOSFET Q5 constituting a leakage current path. A switch MOSFET Q7 to be controlled by the negative voltage generated by the aforementioned inverted pulses is connection in parallel with the MOSFET Q6 of the diode shape. Specifically, the negative voltage generated by the capacitor CB2 is outputted without any level loss by the switch MOSFET Q7 in place of the MOSFET Q6 of the diode shape when the control valve VC drops to a predetermined potential.

In the circuit for generating the negative voltage by the MOSFET Q3 of the diode shape as in the negative voltage generator corresponding to the inverted pulses, a control voltage VC will drop to −(VCC-2 Vth) at the lowest. If the MOSFET Q7 is used, on the contrary, the capacitor CB1 is subjected to the precharge operation, when the capacitor CB2 generates a negative voltage of −(VCC-Vth), so that the voltage is changed to a positive potential such as +Vth. As a result, the MOSFET Q7 is turned on to transmit the aforementioned negative voltage of −(VCC-Vth) to the capacitor C2 without any level loss. Therefore, the circuit for generating the negative voltage from the inverted pulses basically generates the control voltage of the aforementioned switch MOSFET Q7, and the MOSFET Q3 of the diode shape may then be omitted.

Figure 16:
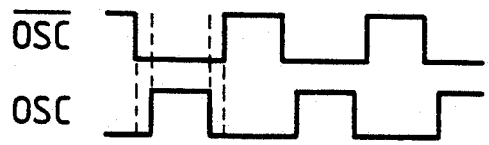
FIG. 16 is a waveform chart for explaining one example of oscillating pulses to be used in the substrate voltage generator.

For the aforementioned negative voltage generating operations by the switch control, the oscillating outputs generated by the oscillator circuit OSC are non-overlap pulses having phases opposed to each other, as shown in FIG. 16. Specifically, when a constant period elapses after the inverted output $\overline{OSC}$ changes from the high level to the low level, the non-inverted pulses OSC change from the low level to the high level, as indicated by dotted lines. Likewise, when a constant period elapses after the non-inverted output OSC changes from the high level to the low level, the inverted pulses $\overline{OSC}$ change from the low level to the high level.

In FIG. 15, the substrate voltage generator VBBG is constructed of a circuit similar to the aforementioned one. However, the aforementioned leakage current circuit R and the corresponding P-channel MOSFET Q are omitted.

This embodiment may commonly use a substrate voltage generator VBBG2 and the oscillating circuit of the aforementioned control voltage generator VBBC. The oscillating circuit OSC owned by a substrate voltage generator VBBG1 is operated by the control signal CE1 which is fed from the timing generator TG. The capacitor C1 is a parasitic capacitor between the substrate and the earth potential of the circuit.

The substrate voltage generator VBBG2 is identical in the circuit structure to the substrate voltage generator VBBG1 except that the oscillator circuit OSC is not fed with the control signal CE1.

What belongs to one circuit is to operate in a steady state and to have a current feeding ability as small as an ability to compensate the leakage current to be steadily generated between the substrate and the earth potential of the circuit. Moreover, another circuit is started automatically or by the monitor output of the substrate voltage VBB, when a memory access (read/write or refresh) operating is performed for the PSRAM, so that it has a relatively high current feeding ability. The circuit thus intermittently operated may be controlled with the aforementioned operation control signal by replacing the two inverter circuits made receptive of the inverted and non-inverted oscillating pulses, as shown in the same Figure, by a NAND or NOR gate circuit.

The substrate voltage VBB thus generated by that substrate voltage generator VBBG is promptly extracted in accordance with the control voltage VC (or VBB') fed to the gate of the aforementioned MOSFET Q8 in response to the aforementioned drop of the supply voltage VCC, without providing any steady leakage current circuit.

Figure 17:
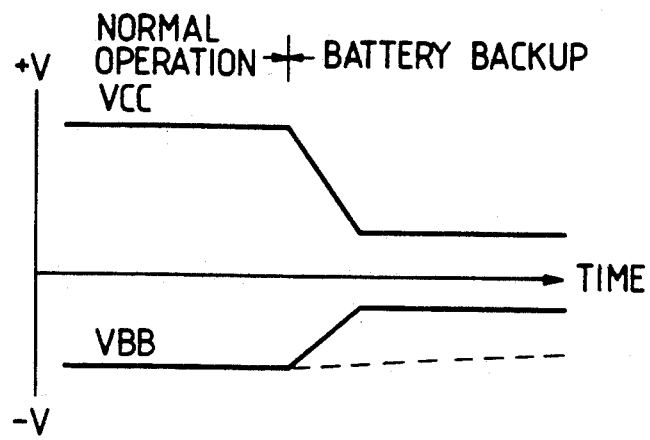
FIG. 17 is a characteristic diagram for explaining the operation of the substrate voltage generator according to the present invention.

When the supply voltage VCC is switched, as shown in FIG. 17, from a relatively high level as in the normal operation to a lower battery backup voltage, the P-channel MOSFET Q5 is in the ON state while the non-inverted pulses are at the low level. As a result, the high precharge voltage stored in the capacitor CB2 is leaked through the resistor R. Since, at this time, the MOSFET Q7 is in the ON state, the control voltage VC (or VBB') is extracted by the charge share between the capacitors CB2 and C2.

When the control voltage VC thus changes as the supply voltage VCC drops, the gate voltage of the MOSFET Q8 relatively rises. When the difference voltage from the substrate voltage VBB exceeds the threshold voltage Vth of the MOSFET Q8, this MOSFET Q8 turns on to extract the substrate voltage VBB. Thus, the substrate voltage VBB rapidly drops with the change in the control voltage VC without providing a direct leakage path for the substrate voltage VBB. As a result, the self-refresh operation in the battery backup and the aforementioned timer operation are validated.

Incidentally, the aforementioned leakage resistor R has such a low current value as will not increase the current consumption, because it extracts the excessive charges of the capacitors CB1 and CB2 which are given small capacities especially for generating the control voltage VC. If the aforementioned low-level period of the oscillating pulses is sufficient long for the time constant of the resistor R and the capacitor CB2, the leakage speed can be easily controlled because the extracting speed is determined only by the charge share between the capacitors CB2 and C2.

Figure 18:
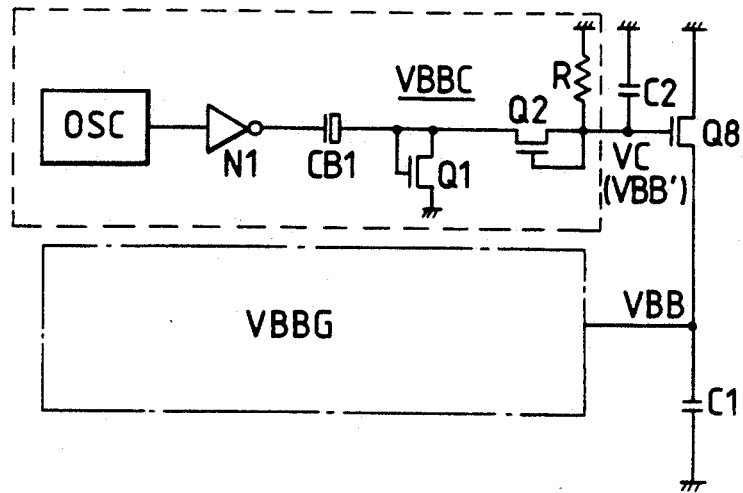
FIG. 18 is a circuit diagram showing another embodiment of the substrate voltage generator according to the present invention.

FIG. 18 is a block diagram showing another embodiment of the substrate voltage generator.

The control voltage generator VBBC of this embodiment is constructed of a capacitor CB1, MOSFETs Q1 and Q3 of the diode shape, and a leakage current resistor R connected in parallel with the capacitor C2 for holding the control voltage VC. What is owned by the capacitor C2 of the control voltage generator VBBC is a capacity as low as the gate capacity of the MOSFET Q8 for discharging the substrate voltage VBB. Therefore, the inverter circuit N1 for generating a negative voltage, the capacitor CB1 and the MOSFET Q1 and Q2 are composed of elements having relatively small sizes. Since the capacitor C2 has a low capacity, the control voltage VC following the fluctuations of the supply voltage VCC can be generated in the low current consumption. Since the MOSFET Q8 feeds the discharge current between the substrate and the earth potential of the circuit in response to the difference voltage between the voltage VC and the substrate voltage VBB, the substrate voltage VBB can be changed in accordance with the change in the aforementioned control voltage VC, in other words, the fluctuations of the supply voltage VCC indirectly through the control voltage VC.

Incidentally, the substrate voltage generator VBBG may be either composed, as in the control voltage generator VBBC of the same Figure, of an inverter circuit, a capacitor and two MOSFETs of a diode shape or made of the circuit, as shown in FIG. 15.

Figure 19:
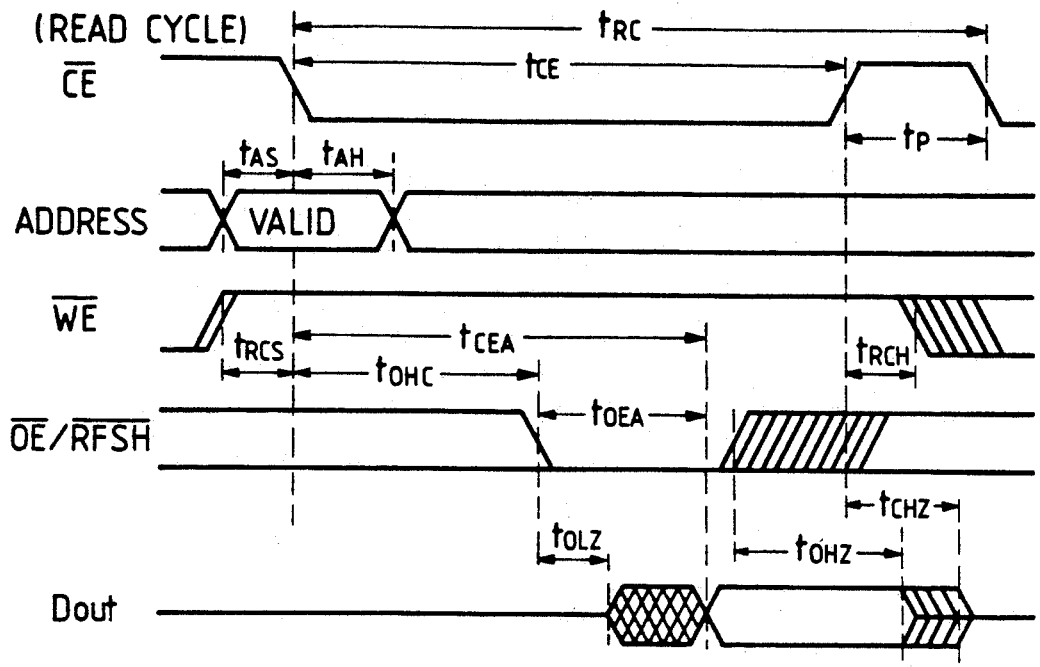
FIG. 19 is a timing chart showing one example of the read cycle of the quasi-static RAM.

FIG. 19 is a timing chart showing one embodiment of the read cycle of the aforementioned quasi-static RAM.

The quasi-static RAM of this embodiment is brought into the read cycle on condition that the write enable signal $\overline{WE}$ is at the high level at the falling edge of the chip enable signal $\overline{CE}$. The output enable signal $\overline{OE}$ is temporarily dropped to the low level at such a predetermined timing as will not delay the output operation of the read data. Address input terminals A0 to A10 and A11 to A18 are fed with X-address signals of 11 bits and Y-address signals of 8 bits, respectively, in synchronism with the falling edge of the chip enable signal $\overline{CE}$. In the same Figure, one of those address signals is illustrated as a representative. Data input/output terminals IO0 to IO7 are normally in a high-impedance state and are fed, when a predetermined access time elapses, with the read data of 8 bits, which are outputted from eight memory cells selected simultaneously.

Figure 20:
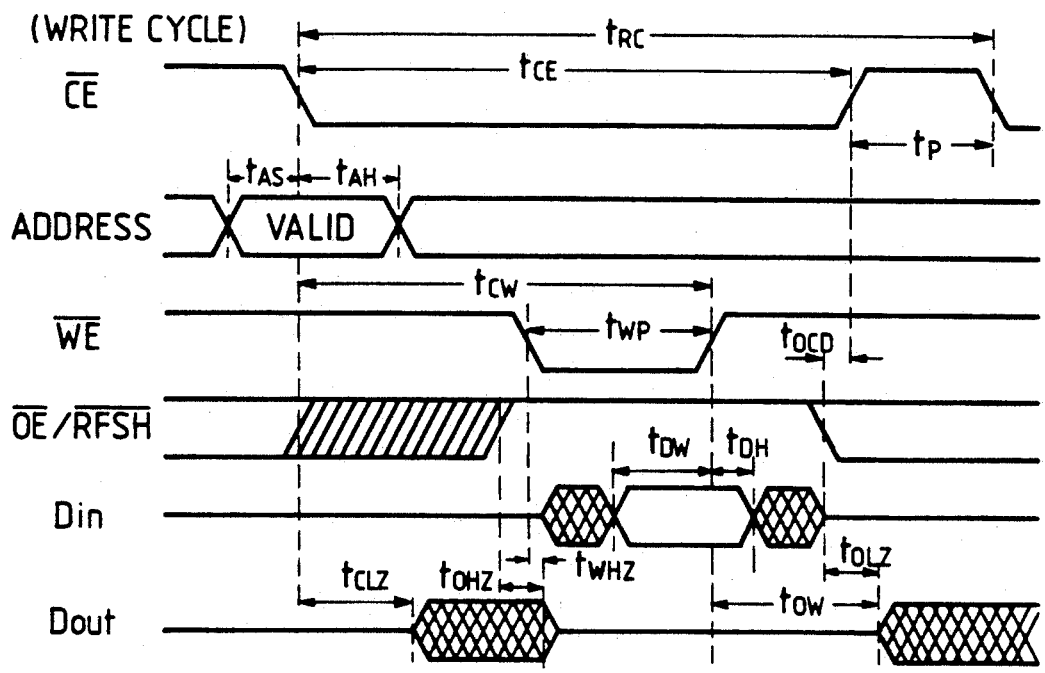
FIG. 20 is a timing chart showing one example of the write cycle of the quasi-static RAM.

FIG. 20 is a timing chart showing one embodiment of the write cycle of the aforementioned quasi-static RAM.

The quasi-static RAM is brought into the write cycle on condition that the write enable signal $\overline{WE}$ is dropped to the low level at the falling edge of the chip enable signal $\overline{CE}$ prior to this signal $\overline{CE}$ or is temporarily dropped to the low level at a predetermined timing after the chip enable signal $\overline{CE}$. The address input terminals A0 to A10 and A11 to A18 are fed with the X- and Y-address signals, and the data input/output terminals IO0 to IO7 are fed with the write data of 8 bits at such a predetermined timing as will not delay the write operation.

Figure 21:
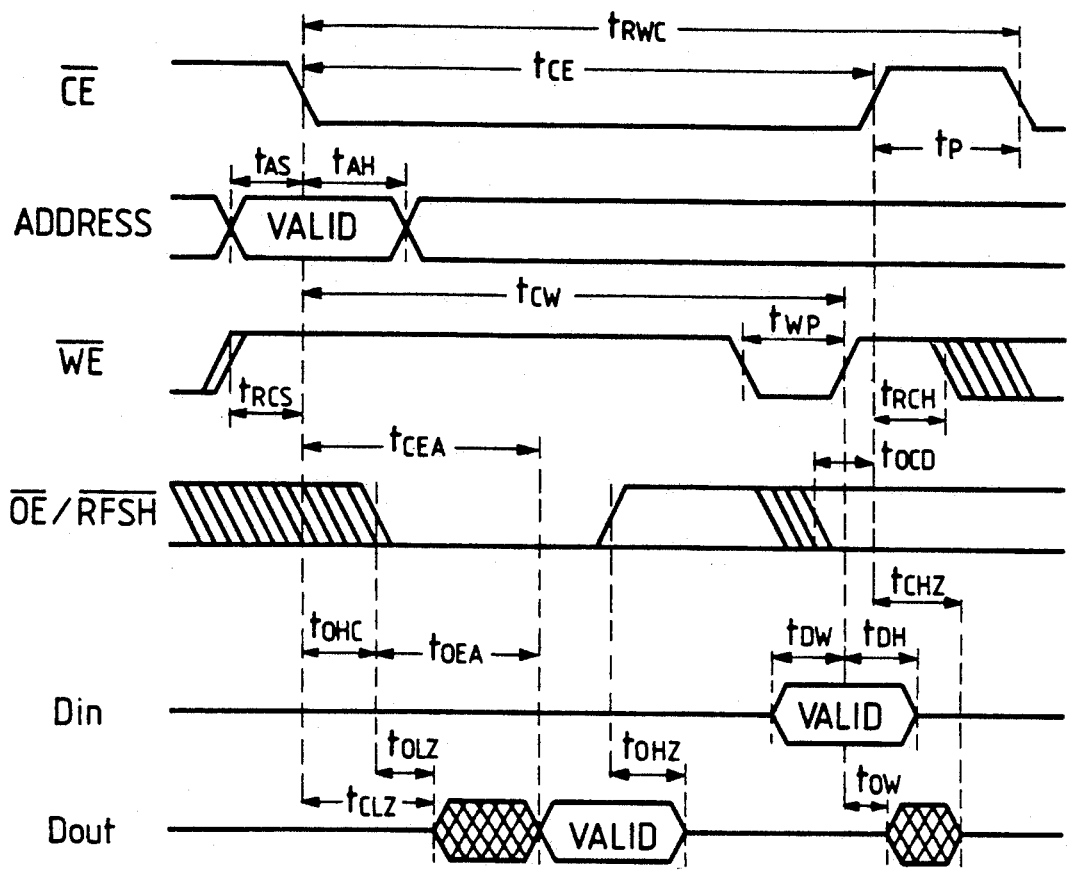
FIG. 21 is a timing chart showing one example of the read-modify-write cycles of the quasi-static RAM.

FIG. 21 is a timing chart showing one embodiment of the read-modify-write cycles of the aforementioned quasi-static RAM.

This operation cycle is, so to speak, one which has the aforementioned read cycle and write cycle combines. At the falling edge of the chip enable signal $\overline{CE}$, the output enable signal $\overline{OE}$ and the write enable signal $\overline{WE}$ are at the high level so that the read cycle is started at first. After the read data of the assigned data have been transmitted from the data input/output terminals IO0 to IO7, the write data of 8 bits fed from the data input/output terminals IO0 to IO7 are written at the aforementioned address when the write enable signal $\overline{WE}$ is temporarily dropped to the low level.

Figure 22:
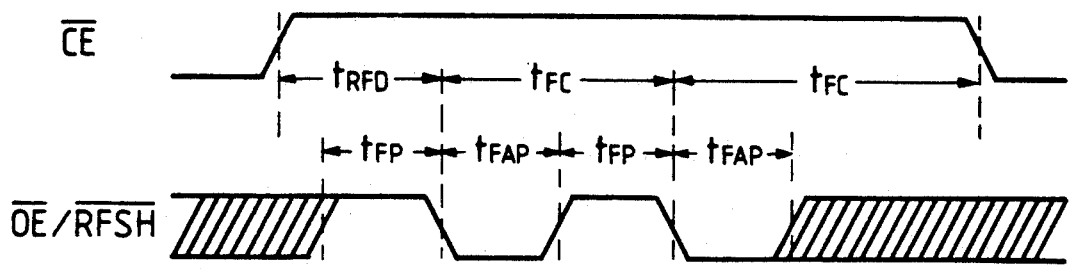
FIG. 22 is a timing chart showing one example of the auto-refresh cycle of the quasi-static RAM.

FIG. 22 is a timing chart showing one embodiment of the auto-refresh cycle of the aforementioned quasi-static RAM.

The quasi-static RAM executes the auto-refresh cycle on condition that the output enable signal $\overline{OE}$ (or the refresh control signal $\overline{RFSH}$) is temporarily dropped to the low level for a relatively short time ($t_{FAP}$) while the chip enable signal $\overline{CE}$ is fixed at the high level. At this time, the refresh address for addressing the word lien to be refreshed is fed from the refresh counter which is built in the quasi-static RAM.

In the quasi-static RAM of this embodiment, unlike the aforementioned self-refresh operation, the totally two word lines addressed by the refresh counter RFC are simultaneously selected so that the corresponding totally 2,048 memory cells are refreshed all at once. The refresh counter RFC is automatically updated at an instant after its output signal, i.e., the refresh address is fetched by the X-address buffer.

The representative of the individual access times shown in the foregoing timing charts of FIGS. 19 to 22 are as follows. Letters $t_{RC}$ designate a random read-/write cycle time; letters $t_{CEA}$ designate a chip enable access time; letters $t_{RWC}$ designate a read-modify-write cycle time; letters $t_{OEA}$ designate an output enable access time; letters $t_{AH}$ designate an address hold time; letters $t_{AS}$ designate an address setup time; letters $t_P$ designate a chip enable precharge time; and letters $t_{FC}$ designate an auto-refresh cycle time.

The quasi-static RAM of this embodiment has its operation warranted within a voltage range from about 5 V or 3.6 V to 1.5 V, as has been described hereinbefore. For example, in case the maximum is 3.6 V, the voltage fluctuation range is as small as about 2 V in the absolute value, but the maximum operating voltage of 3.6 V is relatively high, i.e., about two times as high as the minimum operating voltage of 1.5 V.

Within such relatively wide voltage range, the operating speed and the current consumption have relatively large fluctuation ranges. Since, moreover, the operations can be accomplished with the different voltages of a plurality of kinds of batteries, the AC characteristics such as the access time and the DC characteristics such as the current consumption are determined for the plural operating voltages, as enumerated in the following Table-2 and Table-3:

TABLE 2

| Parameters | Supply Voltage VCC | | |
|---|---|---|---|
| | 1.6 V | 2.6 V | 3.6 V |
| $t_{RC}$ | 250 min | 180 min | 160 min |
| $t_{CEA}$ | 150 max | 100 max | 80 max |
| $t_{OEA}$ | 50 max | 30 max | 30 max |
| $t_{AH}$ | 40 min | 30 min | 20 min |
| $t_{DW}$ | 35 min | 25 min | 20 min |
| $t_{FC}$ | 250 min | 180 min | 160 min |

TABLE 3

| Parameters | Supply Voltage VCC | | |
|---|---|---|---|
| | 1.6 V | 2.6 V | 3.6 V |
| $I_{CC1}$ | 15 mA | 25 mA | 40 mA |
| $I_{CC3}$ | 6 µA | 10 µA | 20 µA |

Table-2 enumerates one example of a plurality of representative AC characteristics at the minimum voltage (1.6 V) min, the central voltage (2.6 V) typ and the maximum voltage (3.6 V) max. In this Table-2, the unit is ns (nanoseconds).

Table-3 enumerates one example of a plurality of representative DC characteristics at the minimum voltage (1.6 V) min, the central voltage (2.6 V) typ and the maximum voltage (3.6 V) max.

Here, letters $I_{CC1}$ designate the current consumed at the memory access time, and letters $I_{CC3}$ designates the current consumed in the self-refresh mode.

The aforementioned minimum voltage of 1.6 V imagines the case, in which the Pb battery is mainly used; the central voltage of 2.6 V imagines the case, in which the Ni-Cd and Li batteries are used; and the maximum voltage of 3.6 V imagines the case, in which the Li battery is used. The user is allowed to have a convenient use by determining the AC and DC characteristics for each of the different voltage batteries. If the AC characteristics and DC characteristics in the worst case are determined as in the prior art, the user of the Ni-Cd battery or the Li battery is obliged to use it below the performance owned by the PSRAM. In the CMOS integrated circuit premising the using method in which the relative voltage fluctuating range is as large as above, the speed by the operating voltage and the fluctuating ranges of the current consumption are so large that the user is allowed to construct a remarkably rational system exploiting the performance of the CMOS integrated circuit by exhibiting the AC and DC characteristics according to the individual supply voltages. Especially in case the battery voltage is used as the operating voltage as in this embodiment, the battery capacity is limited, but the user is allowed to perform the system design considering the battery lifetime by indicating the aforementioned DC characteristics for each voltage so that the system can be prevented from being halted by an unexpected battery discharge or the like.

In case of the operations of the CMOS circuit within the relatively wide voltage range at the aforementioned relatively low voltage, the conductance characteristics of the MOSFETs are relatively highly changed by the operating voltage. If, therefore, the CMOS inverter circuit is used as a delay as in the CMOS circuit of the prior art, the voltage dependency of the delay time is so high that a stable timing operation cannot be expected.

Figure 23:
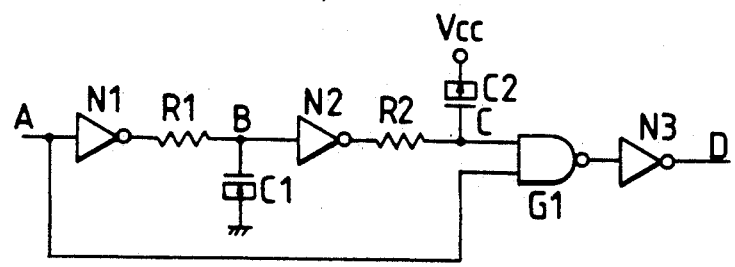
FIG. 23 is a circuit diagram showing one embodiment of a delay circuit according to the present invention.

FIG. 23 is a circuit diagram showing one embodiment of the delay circuit which is suited for the CMOS integrated circuit according to this invention.

In this embodiment, a delay circuit is constructed by using a time constant circuit, which is composed of a resistor R1 made of a poly-silicon layer and a MOS capacitor C1, so as to eliminate the voltage dependency of the delay time. In the same Figure, there is shown an example of the delay circuit for generating an output signal D which rises with a delay time TD at the rising time of the input signal A from the low level to the high level.

The input signal A is inputted through the CMOS inverter circuit N1 to the time instant circuit which is composed of the aforementioned resistor R1 and capacitor C1. A delay signal B thus generated by the time constant circuit R1 and C1 is amplified by the CMOS inverter circuit N2 and is transmitted to a time constant circuit which is composed of similar resistor R2 and capacitor C2. Moreover, a delay signal C thus formed by that time constant circuit R2 and C2 is fed to one input of a NAND gate circuit G1. The other input of this NAND gate circuit G1 is fed with the aforementioned input signal A. The output signal of the aforementioned NAND gate circuit G1 is outputted as a delay signal D through the outputting CMOS inverter circuit N3.

The aforementioned capacitor C1 connects the common connection of the source and drain of the N-channel MOSFET with the earth potential of the circuit, and the capacitor C2 connects the common connection of the source and drain of the P-channel MOSFET with the supply voltage Vcc.

Figure 24:
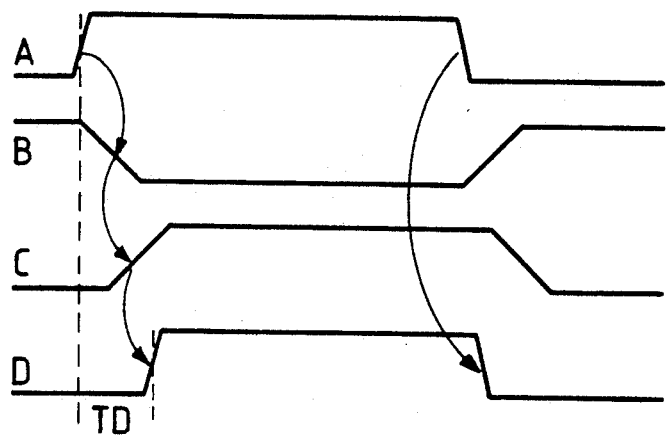
FIG. 24 is a waveform chart for explaining one example of the operation of the delay circuit.

FIG. 24 is a waveform chart for explaining one example of the operation of the aforementioned delay circuit.

If the input signal A changes from the low level to the high level, the output signal of the inverter circuit N1 accordingly changes from the high level to the low level so that the signal B changes from the high level to the low level in accordance with the time constant of the aforementioned resistor R1 and capacitor C1. The output signal of the inverter circuit N2 made receptive of the change in that signal B changes from the low level to the high level so that the signal C changes from the low level to the high level in accordance with the time constant of the aforementioned resistor R2 and capacitor C2.

The NAND gate circuit G1 has its gate opened in response to the high level (i.e., the logic "1") of the aforementioned input signal A so that it operates substantially as an inverter circuit. If, therefore, the aforementioned signal C changes from the low level to the high level so that it reaches the logic threshold voltage, the output signal is changed from the high level to the low level. Thus, the delay signal D to be outputted through the inverter circuit N3 rises from the low level to the high level with the delay time TD corresponding to the time constants of the aforementioned time constant circuits R1 and C1, and R2 and C2. Incidentally, since the inverter circuits N1 to N3 and the gate circuit G1 have signal propagation delay times smaller than the aforementioned time constant, it cannot be exaggerated that the aforementioned delay time TD is substantially determined by the time constants of the aforementioned time constant circuits R1 and C1, and R2 and C2.

When the input signal A changes from the high level to the low level, the output signal of the NAND gate circuit G1 accordingly changes to the high level. Even if the signal C remains at the high level, the output signal is independently changed to the high level. Thus, the output signal D having passed through the inverter circuit N3 instantly changes to the low level. As a result, the delay circuit of this embodiment generates the output signal D with the delay time TD in response to the rise of the input signal A, as has been described hereinbefore.

Figure 25:
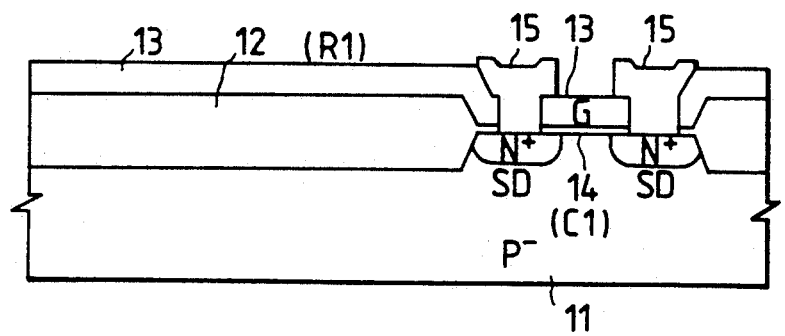
FIG. 25 is an element structure section showing one embodiment of a resistor and a capacitor to be used in the delay circuit.

FIG. 25 is an element structure section showing one embodiment of the aforementioned resistor R1 and capacitor C1.

On the surface of the element forming region of a $P^-$-type semiconductor substrate 11, there are formed $N^+$-type source and drain regions SD by the same manufacture step as that for forming the ordinary N-channel MOSFET. The semiconductor substrate is further formed thereover except the aforementioned element forming region with a thick field insulating film 12. The element forming region including the substrate surface between the aforementioned paired source and drain regions SD is formed with a thin gate insulating film 14. Over the aforementioned field insulating film 12 and gate insulating film 14, there is formed a first poly-silicon layer 13. This first poly-silicon layer 13 is doped from its surface with a semiconductor impurity at the portions for forming the gate electrode of the MOSFET and the resistor R1, to form a first conductive poly-silicon layer 13 to be utilized as the gate electrode G, the resistor R1 and the wiring layer.

The gate oxide film and the poly-silicon layer on the aforementioned source and drain regions are selectively removed to form an ohmic contact, which is formed an aluminum layer 15 for supplying the earth potential. Incidentally, the gate electrode G acting as one electrode of the aforementioned resistor R1 and capacitor C1 is integrally formed. The wiring line for connecting the delay signal C with the gate electrodes of the N-channel MOSFET and P-channel MOSFET constituting the not-shown inverter circuit N2 is exemplified by the aluminum wiring line which is formed at the same step as that of the aluminum wiring line 15 for feeding the earth potential to the aforementioned capacitor C1.

Figure 26:
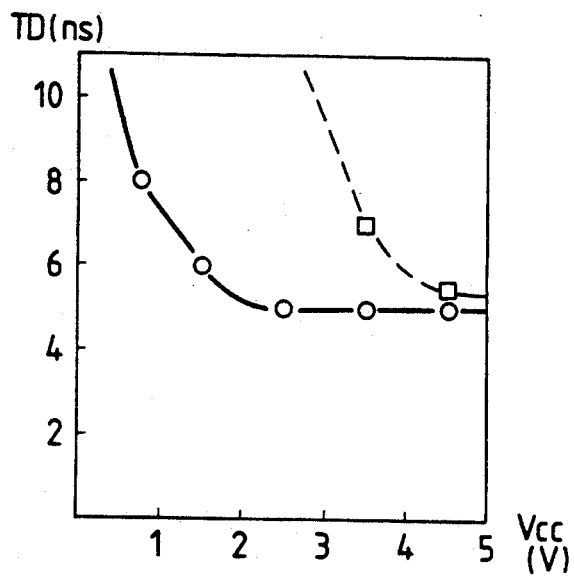
FIG. 26 is a characteristic diagram showing the voltage dependencies of the delay circuit according to the present invention and the delay circuit using an inverter circuit of the prior art.

FIG. 26 is a characteristic diagram showing the delay times of the delay circuit according to this invention and the delay circuit using the inverter circuit of the prior art. In the same Figure, a solid curve plots the delay characteristics of the delay circuit according to the present invention, and a broken curve plots the delay characteristics of the delay circuit using the inverter circuit of the prior art.

The delay circuit of this embodiment utilizes the poly-silicon resistance element having no temperature dependency and the MOS capacitor. As a result, the voltage dependency is high in a low voltage region of 1 V or less due to the power supply dependency which is owned by the inverter circuit inserted mainly for waveform shaping or the like. Nevertheless, a substantially constant delay time can be achieved at a voltage higher than the minimum voltage of 1.6 V, which is to be warranted by the PSRAM of this embodiment.

In case, on the contrary, the inverter circuit is used as in the prior art, the delay time is abruptly increased from a voltage of 4.5 V or less, which cannot be warranted by the RAM of the prior art, so that a stable delay time cannot be attained.

Therefore, in the CMOS circuit for warranting the operating voltage having a relatively large voltage range with the low voltage as in the PSRAM according to this invention, it cannot be exaggerated that the delay circuit utilizing the poly-silicon resistor and the MOS capacitor, as exemplified in the foregoing embodiment, is indispensable for the stable timing operations.

The operational effects to be achieved from the foregoing embodiments are as follows:

(1) The self-refresh operation of one round of the RAM using the dynamic memory cells is accomplished on the basis of the periodic pulses which are formed by the oscillating circuit substantially having no temperature dependency, and the self-refresh period is controlled by the timer circuit using the time constant circuit corresponding to the temperature dependency of the data storage in the aforementioned memory cells. As a result, the self-refresh operation for a long period matching the amount of data storage of the memory cells can be accomplished to attain an effect that the power consumption is reduced.

(2) The time constant circuit is constructed by connecting the capacitor smaller by one figure with the address selecting MOSFETs of a plurality of dummy cells. As a result, there can be attained an effect to provide a time constant circuit which corresponds highly accurately one by one to the data holding characteristics of the equivalently worst case of the memory cells.

(3) The comparator used for monitoring the hold voltage of the capacitor composing the aforementioned time constant circuit is exemplified by the differential amplifier to be operated by a fine current and the inverter circuits connected in tandem for amplifying the amplified output of the amplifier. As a result, there can be attained an effect that a highly accurate voltage monitor can be accomplished in a low power consumption.

(4) The aforementioned refreshing oscillator circuit is steadily operated in the self-refresh mode, and its oscillating pulses are counted by the counter circuit to set the uppermost refresh period. As a result, there can be attained an effect the data holding operation of the memory cells at a low temperature can be compensated.

(5) The RAM having the CMOS structure to be backed up by the battery is exemplified by the quasi-static RAM which is equipped with the input/output interface compatible with the static RAM, so that the refresh operation can be simplified for the memory access like the static RAM. As a result, there can be attained an effect that a conveniently usable memory device can be obtained.

(6) The technical standards for the aforementioned low-voltage CMOS circuit are for the CMOS logic IC of LVCMOS, LVBO and 74HC or AC series determined in the JEDEC STANDARD NO.8/1984. As a result, there can be attained an effect of compatibility with the existing IC.

(7) Since the variable booster circuit to be switched to correspond to the voltage fluctuations is packaged, there can be attained an effect to provide a semiconductor integrated circuit device having a wide operating voltage range.

(8) In the substrate voltage generator, the MOSFETs to be controlled by the control voltage generated by the control voltage generator equipped with the leakage current path are connected between the substrate and the earth potential point of the circuit. As a result, there can be attained an effect that the substrate potential can be changed in accordance to the fluctuations of the supply voltage without increasing the current consumption.

Although our invention has been specifically described in connection with the embodiments thereof, it should not be limited to the embodiments but can naturally be modified in various manners without departing from the gist thereof. For example, the quasi-static RAM shown in FIGS. 1 to 5 may be modified to have its input/output interface compatible with the static RAM. In other words, at least the address signals and the control signals may be similar to those of the static RAM. Moreover, what can be operated by a plurality of kinds of battery voltages as in the foregoing embodiments may be not only the quasi-static RAM but also the dynamic RAM, and this dynamic RAM may be additionally given the aforementioned self-refresh function. On the other hand, the variable booster circuit and the substrate voltage generator may be widely used not only in the dynamic RAM and the quasi-static RAM but also in a variety of semiconductor integrated circuit devices requiring the boosted voltage or the substrate voltage.

The effects to be obtained from the representative of the invention disclosed herein will be briefly described in the following. Specifically, the self-refresh operation of one round of the RAM using the dynamic memory cells is accomplished on the basis of the periodic pulses which are formed by the oscillating circuit substantially having no temperature dependency, and the self-refresh period is controlled by the timer circuit using the time constant circuit corresponding to the temperature dependency of the data storage in the aforementioned memory cells. As a result, the self-refresh operation for a long period matching the amount of data storage of the memory cells can be accomplished to reduce the power consumption. The time constant circuit is constructed by connecting the capacitor smaller by one figure with the address selecting MOSFETs of a plurality of dummy cells. As a result, it is possible to provide a time constant circuit which corresponds highly accurately one by one to the data holding characteristics of the equivalently worst case of the memory cells. Since the variable booster circuit to be switched to correspond to the voltage fluctuations is packaged, it is possible to provide a semiconductor integrated circuit device having a wide operating voltage range. The MOSFETs to be controlled by the control voltage generated by the control voltage generator equipped with the leakage current path are connected between the substrate and the earth potential point of the circuit. As a result, the substrate potential can be changed in accordance to the fluctuations of the supply voltage without increasing the current consumption.

What is claimed is:

1. A semiconductor memory comprising:
   a memory array including a plurality of word lines, a plurality of data lines and a plurality of memory cells each having a MOSFET and a capacitor;
   refresh means for outputting a refresh instructing signal for refreshing each of said memory cells; and
   control signal generating means responsive to said refresh instructing signal for generating a refresh controlling signal,
   wherein said refresh means includes:
   first refresh signal outputting means for outputting a first refresh timing signal for a predetermined period;
   a dummy cell having a plurality of MOSFETs and a capacitor which has a capacity smaller than the total capacity of the capacitor provided for the sources of said MOSFETs;
   a comparator for comparing a voltage held in the capacitor of said dummy cell and a predetermined reference voltage;
   a second refresh signal outputting means responsive to the output signal of said comparator for outputting a second refresh timing signal when said comparator outputs a signal indicating that the held voltage value of said capacitor is lower than said predetermined reference voltage value; and
   signal generating means responsive to said first and second refresh timing signals for generating said refresh instructing signal.

2. A semiconductor memory according to claim 1, wherein said second refresh signal outputting means includes a counter circuit.

3. A semiconductor memory according to claim 2, wherein said counter circuit has a plurality of flip-flops.

4. A semiconductor memory according to claim 3, further comprising:
   a first address terminal group fed with an address for selecting one of said word lines; and
   a second address terminal group fed with an address for selecting one of said data lines.

5. A semiconductor memory system according to claim 1, wherein the capacity of said dummy cell capacitor is smaller by one figure than said total capacity of the capacitor provided for the sources of said MOSFETs.

6. A semiconductor memory system comprising:
   a plurality of semiconductor memories coupled through a data bus and an address bus;
   a control circuit coupled to said semiconductor memories through a control bus,
   wherein each of said semiconductor memories comprises:
   a memory array including a plurality of word lines, a plurality of data lines and a plurality of memory cells each having a MOSFET and a capacitor;
   refresh means for outputting a refresh instructing signal for refreshing each of said memory cells; and
   control signal generating means responsive to said refresh instructing signal for generating a refresh controlling signal,
   said refresh means including:
   first refresh signal outputting means for outputting a first refresh timing signal for a predetermined period;
   a dummy cell having a plurality of MOSFETs and a capacitor which has a capacity smaller than the total capacity of the capacitor provided for the sources of said MOSFETs;
   a comparator for comparing a voltage held in the capacitor of said dummy cell and a predetermined reference voltage;
   a second refresh signal outputting means responsive to the output signal of said comparator for outputting a second refresh timing signal when said comparator outputs a signal indicating that the held voltage value of said capacitor is lower than said predetermined reference voltage value; and
   signal generating means responsive to said first and second refresh timing signals for generating said refresh instructing signal.

7. A semiconductor memory system according to claim 6, wherein said second refresh signal outputting means includes a counter circuit.

8. A semiconductor memory system according to claim 7, wherein said counter circuit has a plurality of flip-flops.

9. A semiconductor memory system according to claim 8, wherein said semiconductor memory further comprises:
   a first address terminal group fed with an address for selecting one of said word lines; and
   a second address terminal group fed with an address for selecting one of said data lines.

10. A semiconductor memory system according to claim 6, wherein the capacity of said dummy cell capacitor is smaller by one figure than said total capacity of the capacitor provided for the sources of said MOSFETs.

* * * * *